(12) United States Patent
Suzuki

(10) Patent No.: US 9,074,866 B2
(45) Date of Patent: Jul. 7, 2015

(54) ROTATIONAL ANGLE MEASUREMENT APPARATUS, CONTROL APPARATUS, AND ROTATION-MACHINE SYSTEM

(75) Inventor: Mutsumi Suzuki, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 21 days.

(21) Appl. No.: 14/129,814

(22) PCT Filed: Jun. 21, 2012

(86) PCT No.: PCT/JP2012/065808
§ 371 (c)(1),
(2), (4) Date: Dec. 27, 2013

(87) PCT Pub. No.: WO2013/002103
PCT Pub. Date: Jan. 3, 2013

(65) Prior Publication Data
US 2014/0125267 A1    May 8, 2014

(30) Foreign Application Priority Data

Jun. 30, 2011 (JP) ................................. 2011-145155

(51) Int. Cl.
*H02P 6/00* (2006.01)
*G01B 7/30* (2006.01)
(Continued)

(52) U.S. Cl.
CPC *G01B 7/30* (2013.01); *G01D 5/145* (2013.01); *G01D 5/24476* (2013.01); *G01R 33/0047* (2013.01); *G01R 33/093* (2013.01); *H02P 6/00* (2013.01); *H02P 6/16* (2013.01)

(58) Field of Classification Search
CPC ...................................................... H02P 6/00
USPC ............. 318/400.39, 400.38, 400.37, 400.01, 318/700
See application file for complete search history.

(56) References Cited

U.S. PATENT DOCUMENTS 6,236,183 B1 *  5/2001  Schroeder ...................... 318/721
6,911,798 B2 *  6/2005  Hori et al. ...................... 318/602
(Continued)

FOREIGN PATENT DOCUMENTS

JP     2007-256034 A    10/2007
JP     2008-533497 A     8/2008
(Continued)

OTHER PUBLICATIONS

PCT International Search Report on application PCT/JP2012/065808 mailed Jul. 24, 2012; 2 pages.

*Primary Examiner* — David S Luo
(74) *Attorney, Agent, or Firm* — Foley & Lardner LLP

(57) ABSTRACT

Rotational angle measurement apparatus measuring magnetic-field angle or rotational angle with sufficient accuracy wherein a non-magnetic conductor is arranged in the vicinity of the magnetic flux generator or the magnetic sensor, even when the magnetic flux generator rotates at high speed. The rotational angle measurement apparatus is configured with a magnetic sensor 70 which responds to a magnetic-field angle and a detection unit 302 which inputs an output of the magnetic sensor. The rotational angle measurement apparatus is employed with a rotatable body 121 provided with a magnetic flux generator 202. The output of the magnetic sensor is a raw-angle signal set 155 corresponding to the magnetic-field angle. The detection unit outputs a corrected angle after a non-magnetic conductor in the vicinity of the magnetic sensor is corrected, using a correction value outputted by a correction function with rotational velocity of the rotatable body as an argument.

24 Claims, 12 Drawing Sheets

(51) Int. Cl.
*G01D 5/14* (2006.01)
*G01D 5/244* (2006.01)
*G01R 33/00* (2006.01)
*G01R 33/09* (2006.01)
*H02P 6/16* (2006.01)

(56) References Cited

U.S. PATENT DOCUMENTS

2006/0208726 A1 9/2006 Mock et al.
2007/0001668 A1 1/2007 Mock et al.
2010/0219822 A1 9/2010 Suzuki et al.
2010/0225307 A1 9/2010 Takahashi
2010/0321006 A1 12/2010 Suzuki
2011/0115477 A1 5/2011 Suzuki
2013/0063135 A1 3/2013 Suzuki et al.
2013/0264915 A1 10/2013 Suzuki et al.

FOREIGN PATENT DOCUMENTS

| JP | 2010-197318 A | 9/2010 |
| JP | 2011-002311 A | 1/2011 |
| JP | 2011-106935 A | 6/2011 |
| JP | WO 2011-141969 A1 | 11/2011 |
| JP | 2012-137457 A | 7/2012 |
| JP | 2013-104698 A | 5/2013 |
| JP | 2013-205032 A | 10/2013 |

* cited by examiner

ROTATIONAL ANGLE MEASUREMENT APPARATUS, CONTROL APPARATUS, AND ROTATION-MACHINE SYSTEM

TECHNICAL FIELD

The present invention relates to a rotational angle measurement apparatus with a magnetic sensor, a rotation machine, and a rotation-machine system, and also relates to a control apparatus for controlling a rotation machine, etc., by processing a magnetic sensor signal.

BACKGROUND ART

A magnetic flux generator (hereinafter called a "sensor magnet") is installed in a rotatable body, and a magnetic sensor is installed in a location within the reach of magnetic flux generated by the magnetic flux generator. It is known that, when the rotatable body rotates, the angle of the magnetic flux generated by the sensor magnet also rotates, and that the rotational position (rotational angle) of the rotatable body can be measured by detecting the angle of the magnetic flux through the use of a magnetic sensor.

Here, the magnetic sensor is broadly divided into two groups: a magnetic-field-intensity-measurement sensor which outputs a signal corresponding to the intensity of magnetic field, and a magnetic-field-angle-measurement sensor which outputs a signal corresponding to the angle of magnetic field. Since the magnetic-field-angle-measurement sensor measures the angle of magnetic field as a vector, it is also called a vector-type magnetic sensor.

The magnetic-field-angle-measurement sensor includes one which employs a Hall-effect element as a magnetic-field detection element, one which employs a magneto-resistance element, and others.

The Hall-effect element itself is an element which outputs a signal corresponding to the magnetic field intensity. However, it is possible to output a signal corresponding to an angle of magnetic field, by measuring the spatial difference of the magnetic field intensity with the use of plural pieces of Hall-effect elements, and detecting a cosine component (COS component) and a sine component (SIN component) of the magnetic field.

There is also a sensor which measures a magnetic-field angle by employing a suitably-shaped magnetic material and plural pieces of Hall-effect elements. This type of magnetic sensor concentrates a magnetic flux with the magnetic material and converts the magnetic-field angle into a difference in the magnetic field intensity, which is then measured by the plural pieces of Hall-effect elements.

In this way, there exist various kinds of magnetic sensors of the type of a magnetic-field-angle-measurement sensor which is configured with Hall-effect elements and outputs a signal corresponding to the magnetic-field angle.

The magneto-resistance element is an element of which the electrical resistance changes depending on the intensity of magnetic field or the angle of magnetic field. The magneto-resistance element includes an anisotropic magneto-resistance element (hereinafter called an "AMR element"), a giant magneto-resistance element (hereinafter called a "GMR element"), and a tunneling magneto-resistance element (hereinafter called a "TMR element").

An AMR element changes electrical resistance depending on the angle between the angle of magnetic field and the angle of electric current. By combining appropriately an element with a different angle of electric current, a signal corresponding to the angle of magnetic field is outputted. A GMR element has a configuration in which a pinned magnetic layer and a free magnetic layer are laminated with a spacer layer sandwiched therebetween. By combining appropriately an element with a different angle of spin (angle of magnetization) in the pinned magnetic layer, a signal corresponding to the angle of magnetic field is outputted. The GMR element which has a pinned magnetic layer is also called a spin-valve type GMR element.

One of the advantages of the rotational angle sensor which employs a magnetic sensor is that the rotational angle sensor is a non-contact type. The non-contact type refers to that the rotatable body and the sensor as a detector for detecting a rotational position are mechanically non-contact. That is, because of being not mechanically in contact, even when the rotatable body rotates at a high speed and is employed over a long period of time, mechanical wear does not occur; accordingly a reliable sensor is realized.

Another advantage of the rotational angle sensor which employs the magnetic sensor is that it is possible to increase the distance between the rotatable body and the sensor. This is originated from the fact that the effect of magnetic field reaches up to a comparatively long distance. For example, when a magnetic sensor employing a GMR element and a sensor magnet (magnetic flux generator) of a neodymium magnet are combined, the distance between them can be increased up to about 5-15 mm. As compared with this, in a resolver which measures a rotational angle by change of reluctance, the distance between a rotatable body and a detector (sensor) is as narrow as about several 100 μm. The fact that the large distance between a rotatable body and a sensor is allowed has advantages such as improving design flexibility or relaxing manufacturing tolerance of the rotation machine (for example, a motor) which uses a rotatable body as a component.

Another advantage of the rotational angle sensor which employs a magnetic sensor is that a non-magnetic body may exist between a rotatable body and a sensor. Since magnetic susceptibility $\chi$ of a non-magnetic material is almost zero ($|\chi|<0.1$), relative permeability $\mu_r$ is approximately 1 and is nearly equal to the relative permeability of the air. Therefore, even if there exists a non-magnetic material, the angle of magnetic field changes only to a negligible degree. This fact leads to an advantage for improving the design flexibility of a rotation machine (for example, a motor) which uses a rotatable body as a component.

In a rotational angle sensor in the past, in cases where a non-magnetic conductor (electrical conductor) is arranged between a magnetic flux generator installed in a rotatable body and a magnetic sensor, when the rotatable body rotates or moves at high speed, there occurs the problem that it is difficult to measure an angle of magnetic field correctly due to an eddy current generated. That is, when a magnetic flux generator rotates at high speed, the magnetic field in the position of the conductor changes in time and an eddy current is generated inside the conductor. The generated eddy current induces an eddy-current-based magnetic field and the magnetic-field distribution becomes different from the original magnetic-field distribution which is generated by the magnetic flux generator. Therefore, it becomes difficult for the magnetic sensor to detect correctly the angle of magnetic field which the magnetic flux generator itself generates.

On this problem, in cases where a magnetic flux generator (sensor magnet) rotates and produces the influence of an eddy current, Patent Literature 1 prevents the generation of an eddy current by employing a non-conductive material (electrically non-conductive material), such as a ceramics, as a non-magnetic material arranged between the rotatable body and the magnetic sensor.

PATENT LITERATURE

PTL 1: Published Japanese Translation of PCT International Publication No. 2008-533497

SUMMARY OF INVENTION

Technical Problem

Patent Literature 1 employs an electrically non-conductive material in order to reduce the influence of the eddy current generated by arranging a non-magnetic electrical conductor between the magnetic flux generator and the magnetic sensor. However, the problem is that the usable material is restricted to an electrically non-conductive material. Therefore, there is the restriction that an electrical conductor, such as metal, is not allowed to be arranged between the magnetic flux generator and the magnetic sensor.

An eddy current is generated even in other cases than the configuration in which an electrical conductor is arranged between a rotatable body and a magnetic sensor. Even in cases where a magnetic flux generator, a magnetic sensor, and a non-magnetic electrical conductor are arranged in this order, when an eddy current is generated in an electrical conductor due to rotation of the magnetic flux generator, the magnetic field induced by the eddy current may affect the magnetic-field angle in the position of the magnetic sensor.

That is, the eddy-current-based magnetic field is induced when the magnetic flux generator rotates and moves at high speed in the configuration in which the non-magnetic electrical conductor is arranged in the vicinity of the magnetic flux generator or the magnetic sensor. Accordingly, the problem is that, when the magnetic sensor detects the angle of magnetic field generated by the magnetic flux generator itself, the detection accuracy deteriorates.

The purpose of the present invention is to measure a magnetic-field angle or a rotational angle with sufficient accuracy in the configuration in which a non-magnetic conductor (electrical conductor) is arranged in the vicinity of the magnetic flux generator or the magnetic sensor, even when the magnetic flux generator rotates at high speed.

Solution to Problem

The problem can be solved with the following configuration.

A rotational angle measurement apparatus is configured with a magnetic sensor which responds to a magnetic-field angle and a detection unit which receives an output of the magnetic sensor. The rotational angle measurement apparatus is employed with a rotatable body provided with a magnetic flux generator. The output of the magnetic sensor is a raw-angle signal set corresponding to the magnetic-field angle. The detection unit outputs a corrected angle after the influence of a non-magnetic conductor arranged in the vicinity of the magnetic sensor is corrected, with the use of a correction value outputted by a correction function with rotational velocity of the rotatable body as an argument.

A control apparatus is configured with a rotational angle calculation unit which inputs a raw-angle signal set to calculate a corrected angle signal and a control unit which receives the corrected angle signal. The control apparatus is employed with a rotatable body having a magnetic flux generator, and with a magnetic sensor which responds to a magnetic-field angle. The raw-angle signal set is an output signal outputted from the magnetic sensor. The rotational angle calculation unit outputs a corrected angle after the influence of a non-magnetic conductor arranged in the vicinity of the magnetic sensor is corrected, with the use of a correction value outputted by a correction function with rotational velocity of the rotatable body as an argument. The control unit performs processing on the basis of the corrected angle.

Advantageous Effects of Invention

According to the present invention, it is possible to measure a magnetic-field angle or a rotational angle with sufficient accuracy, in the configuration in which a non-magnetic conductor (electrical conductor) is arranged in the vicinity of the magnetic flux generator or the magnetic sensor, even when the magnetic flux generator rotates at high speed.

DESCRIPTION OF EMBODIMENTS

Hereinafter, the embodiment of the present invention is explained in detail with reference to the drawings of examples.

Example 1

As an example of a magnetic sensor of the magnetic-field angle measurement type, a magnetic sensor which employs a GMR element is described hereinafter.

Figure 2:
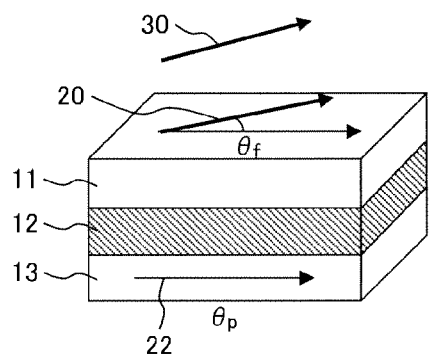
FIG. 2 is a drawing illustrating a configuration of a GMR element.

FIG. 2 illustrates a basic configuration of a GMR element. The GMR element is configured with a first magnetic layer (fixed magnetic layer or pinned magnetic layer) 13, a second magnetic layer (free magnetic layer) 11, and a non-magnetic layer (spacer layer) 12 which is laminated between both magnetic layers. When an external magnetic field is applied to the GMR element, the angle of magnetization 22 of the fixed magnetic layer 13 does not change and is fixed; however, the angle of magnetization 20 of the free magnetic layer 11 changes corresponding to the angle of the external magnetic field 30.

In the present specification, the angle of magnetization 22 of the fixed magnetic layer 13 is called a pin angle and expressed as $\theta_p$.

When a voltage is applied to both ends of the GMR element, an electric current corresponding to the electrical resistance of the element flows. The magnitude of the electrical resistance of the element changes depending on a difference $\Delta\theta = \theta_f - \theta_p$ of the pin angle $\theta_p$ and the angle of magnetization $\theta_f$ (20) of the free magnetic layer 11. Therefore, when the pin angle $\theta_p$ is known, it is possible to utilize this nature to detect the angle of magnetization $\theta_f$ of the free magnetic layer 11 (20), that is, the angle of the external magnetic field 30, by measuring the electrical resistance value of the GMR element.

It is known that the relation between the electrical resistance value of the GMR element and $\Delta\theta$ is expressed by Equation 1.

$$R = R_0' + \frac{G}{2}(1 - \cos\Delta\theta) = R_0 - \frac{G}{2}\cos\Delta\theta \qquad \text{[Equation 1]}$$

Figure 3:
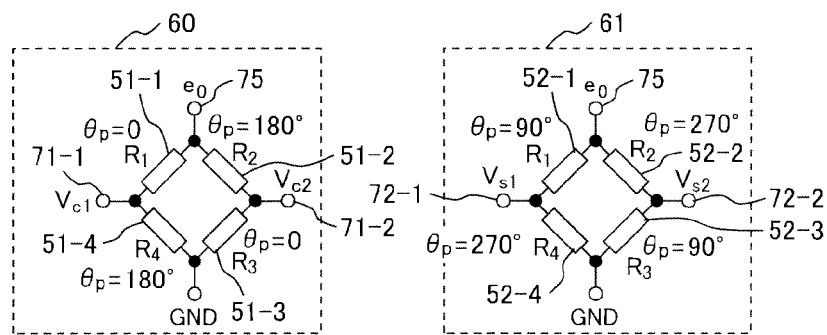
FIG. 3 is a drawing illustrating a configuration of a magnetic sensor which employs the GMR element.

Next, FIG. 3 illustrates an example of configuration of a magnetic sensor which employs a GMR element (GMR type magnetic sensor). The GMR type magnetic sensor is configured with a COS bridge 60 and a SIN bridge 61. The COS bridge 60 composes a Wheatstone bridge 60A employing four GMR elements from $R_1$ (51-1) to $R_4$ (51-4). Here, it is set that the angle of magnetization of the fixed magnetic layer 13 of $R_1$ (51-1) and $R_3$ (51-3) is $\theta_{p1}=0°$, and the angle of magnetization of the fixed magnetic layer 13 of $R_2$ (51-2) and $R_4$ (51-4) is $\theta_{p2}=180°$. The angle of magnetization $\theta_f$ of the free magnetic layer 11 is decided by the external magnetic field and has the same value for four GMR elements, therefore, the following relation holds, that is, $\Delta\theta_2=\theta_f-\theta_{p2}=\theta_f-\theta_{p1}-\pi=\Delta\theta_1+\pi$. Here, $\Delta\theta_1$ is defined relative to $\theta_p=0$, therefore, $\Delta\theta_1$ is rewritten as $\Delta\theta_1=\theta$. Therefore, as seen from Equation 1, as for $R_1$ and $R_3$, the following equation is obtained (n=1, 3).

$$R_n = R_{n0} - \frac{G}{2}\cos\theta \qquad \text{[Equation 2]}$$

As for $R_2$ and $R_4$, the following equation is obtained (n=2, 4).

$$R_n = R_{n0} + \frac{G}{2}\cos\theta \qquad \text{[Equation 3]}$$

Therefore, when a ground terminal (labeled as GND in the figure) is set to 0V and an excitation voltage $e_0$ is applied to an excitation terminal 75, the voltage difference between signal terminals $V_{c1}$ (71-1) and $V_{c2}$ (71-2) is expressed by Equation 4.

$$\Delta V_c = V_{c2} - V_{c1} = \frac{-e_0 G}{2R_0}\cos\theta \qquad \text{[Equation 4]}$$

In this way, the signal voltage $\Delta V_c$ is proportional to $\cos\theta$; accordingly this bridge circuit is called a COS bridge.

In the present example, it is assumed that the excitation voltage $e_0$ is 5V.

Next, the configuration of the SIN bridge 61 is described. The SIN bridge 61 composes a Wheatstone bridge 60B employing four GMR elements $R_1$ (52-1) to $R_4$ (52-4). The SIN bridge 61 is configured by changing the direction of the fixed magnetic layer 13 by 90° from the COS bridge. That is, the bridge is configured with two kinds of GMR elements by setting the angle of magnetization of the fixed magnetic layer 13 of $R_1$ (52-1) and $R_3$ (52-3) as $\theta_p=90°$, and the angle of magnetization of the fixed magnetic layer 13 of $R_2$ (52-2) and $R_4$ (52-4) as $\theta_B=270°$. Here, as is the case with the above, when a ground terminal (labeled as GND in the figure) is set to 0V and an excitation voltage $e_0$ is applied to the excitation terminal 75, the voltage difference between signal terminals $V_{s1}$ (72-1) and $V_{s2}$ (72-2) is expressed by Equation 5.

$$\Delta V_s = V_{s2} - V_{s1} = \frac{e_0 G}{2R_0}\sin\theta \qquad \text{[Equation 5]}$$

In this way, the signal voltage $\Delta V_s$ is proportional to $\sin\theta$; accordingly this bridge circuit 61 is called a SIN bridge. The angle of magnetic-field vector $\theta$ (angle of magnetic field) can be obtained by calculating the arctangent of the ratio of the output signal of the COS bridge 60 and the output signal of the SIN bridge 61.

$$\text{ArcTan}\left(\frac{\Delta V_s}{-\Delta V_c}\right) = \text{ArcTan}\left(\frac{\sin\theta}{\cos\theta}\right) = \theta \qquad \text{[Equation 6]}$$

When Equation 7 is employed in lieu of Equation 6, an angle range of 0-360° (or −180°-+180°) can be obtained.

$$\theta = a\tan 2(\Delta Vs. - \Delta Vc) \quad \text{[Equation 7]}$$

Here, $\theta = a\tan 2 (y, x)$ is a function which outputs appropriately a value of $\theta = 0\text{-}360°$ (or −180-+180°) corresponding to plus or minus of the arguments x and y. For example, when x and y are both plus, $a\tan 2 (y, x) = \text{ArcTan}(y/x)$, and when x and y are both minus, $a\tan 2 (y, x) = \text{ArcTan}(y/x) + 180°$.

In this way, the magnetic sensor configured with GMR elements has the feature of detecting a magnetic-field angle directly. That is, the magnetic sensor functions as a magnetic-field-angle-measurement sensor.

Figure 4:
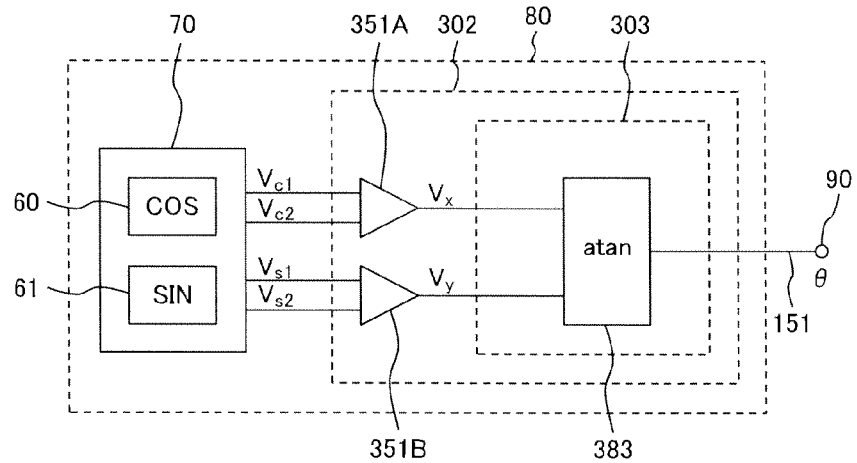
FIG. 4 is a drawing illustrating a configuration of the rotational angle measurement apparatus.

Next, FIG. 4 illustrates a basic configuration of a rotational angle measurement apparatus.

The rotational angle measurement apparatus 80 is configured with a magnetic sensor 70 and a detection unit 302. The magnetic sensor 70 is configured with a COS bridge 60 and a SIN bridge 61 which employ GMR elements. The ground terminal and the excitation terminal 75 of each bridge are not shown in the figure.

Voltage signals $(V_{c1}, V_{c2})$ and $(V_{s1}, V_{s2})$ at the signal terminals of each bridge are inputted to the detection unit 302. The voltage signal pair $(V_{c1}, V_{c2})$ outputted from the COS bridge is inputted to a differential amplifier 351A to output a signal $V_x = V_{c2} - V_{c1}$. The voltage signal pair $(V_{s1}, V_{s2})$ outputted from the SIN bridge is inputted to a differential amplifier 351B to output a signal $V_y = V_{s2} - V_{s1}$.

The signals $V_x$ and $V_y$ are inputted to a signal processing unit 303, and processing according to Equation 7 is performed in an a tan processing unit 383. In this way, an angle signal $\theta$ is outputted.

This is the basic configuration of the rotational angle measurement apparatus.

The following shows an experimental result of the rotational angle rotating at high speed, measured with the use of the basic configuration of the rotational angle measurement apparatus illustrated in FIG. 4.

Figure 5:
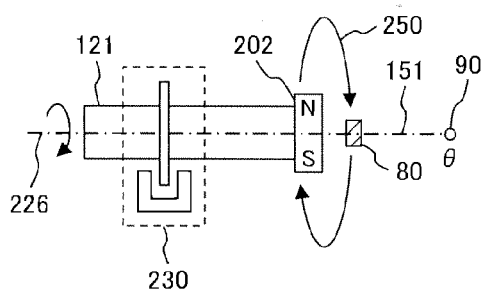
FIG. 5 is a schematic diagram illustrating a configuration of a characterization apparatus for the rotational angle measurement apparatus.

FIG. 5 illustrates a configuration of an experimental device. The experimental device is configured with a rotatable body 121 which is provided with a sensor magnet 202 and rotates around a rotational axis 226. The sensor magnet 202 functions as a magnetic flux generator. Here, a magnet magnetized in two poles is employed. Magnetic field 250 is generated by the rotation, as indicated by an arrow in FIG. 5. Then, a rotational angle measurement apparatus 80 having the configuration illustrated in FIG. 4 is arranged in the vicinity of the sensor magnet 202. The rotational angle measurement apparatus 80 is arranged on the rotational axis 226 at the distance of 10 mm from the sensor magnet 202. When the rotatable body 121 rotates by θ°, the angle of magnetic field generated by the sensor magnet 202 also rotates by θ°.

The angle signal outputted from the rotational angle measurement apparatus 80 was measured by rotating the rotatable body 121 by a motor (not shown). A Z-phase signal generator 230 is installed in the rotatable body 121. The Z-phase signal generator 230 is configured with a disk provided with a slit which allows the light beam to pass through, a light emitting diode, and a light detector. The Z-phase signal generator 230 generates a signal in the position of origin of the rotatable body 121. That is, the time when a signal is generated from the Z-phase signal generator 230 is the time when the rotatable body 121 is located in the position of origin.

In such an experiment configuration, an output angle of the rotational angle measurement apparatus 80 is read at the time when the Z-phase signal generator 230 generates a signal, that is, at the time when the rotatable body 121 is located in the position of origin. The angle read is defined as a phase angle $\theta_z$.

Figure 6:
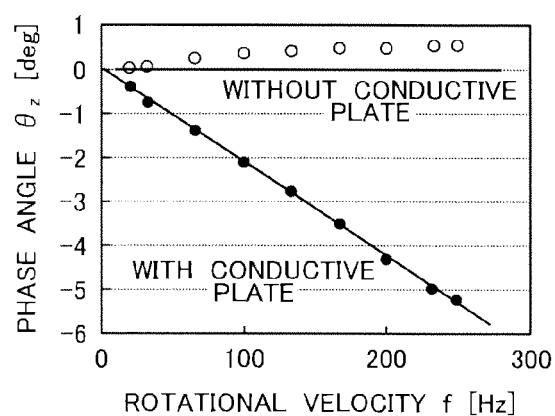
FIG. 6 is a drawing illustrating an experimental result of the relation between a measurement error and rotational velocity.

FIG. 6 shows the result of measurement of the change of the phase angle $\theta_z$ (deg) ("deg" stands for "degree") when the rotational velocity f (Hz) of the rotatable body 121 is changed. Open circles in the figure show the result for the case of no conductor existing in the vicinity of the magnetic sensor 202. The phase angle $\theta_z$ is substantially constant when the rotational velocity is changed in the range of 0-250 (Hz). That is, at the time of the high speed rotation of 250 (Hz) or 15000 (rpm) (revolution per minute), the rotational angle measurement apparatus 80 outputs the correct rotational angle.

Next, a similar measurement is performed by placing an aluminum plate (plate thickness of 1 mm) of a non-magnetic conductor, between the sensor magnet 202 and the rotational angle measurement apparatus 80 in FIG. 5. Filled circles in FIG. 6 show the result.

When the rotatable body 121 is at rest or at 0 Hz, the correct rotational angle is outputted, since the aluminum is a non-magnetic material and does not affect the magnetic-field distribution. However, as the rotational velocity f becomes fast, the phase angle $\theta_z$ deviates from zero and becomes less than −5° at f=250 (Hz) (15000 (rpm)). That is, the angle discrepancy equal to or greater than 5° occurs. This result indicates that it becomes impossible for the rotational angle measurement apparatus 80 to measure the correct rotation angle, due to the fact that the conductor (electrical conductor) has been placed.

It is defined here that a non-magnetic substance is a paramagnetic substance or a diamagnetic substance. It is also defined that a non-magnetic material is a material of which the absolute value of the magnetic susceptibility $\chi$ is 0.1 or less.

The material of a non-magnetic conductor includes aluminum, copper, brass, and SUS304 (a kind of stainless steel), for example.

In the non-magnetic conductor, the absolute value of the magnetic susceptibility $\chi$ is 0.1 or less, therefore, the relative permeability $\mu_r (=1+\chi)$ is 0.9-1.1. Therefore, the permeability of such materials is nearly equal to the permeability in the air and a vacuum. For this reason, in the case of a static magnetic field, even if a non-magnetic conductor is placed, the distribution of the static magnetic field hardly changes.

It is still more preferable to employ as the non-magnetic conductor the material having the absolute value of magnetic susceptibility $\chi$ of 0.01 or less, since the difference of the distribution of the static magnetic field due to the existence or nonexistence of the conductor becomes 1% or less.

A conductor (i.e., electric conductor) is a substance which has electric carriers, such as electrons, ions, or holes, in the substance and in which an electric current flows by movement of electric carriers when a voltage is applied. The relative resistance (i.e., resistivity) of a conductor is about 1 Ωm or less. As described later, the influence of an eddy current is larger as the relative resistance is smaller. Although it depends on shape of a conductor, when the relative resistance becomes $1 \times 10^{-4}$ Ωm or less in particular, the influence of an eddy current appears significantly. When the relative resistance becomes $1 \times 10^{-5}$ Ωm or less, the influence appears still more significantly.

The influence of an eddy current depends also on the shape and arrangement of a conductor, or the rotational velocity of a magnet, as described later. When the induced magnetic field induced by the eddy current generated in the material affects the measurement value of the magnetic field sensor, the material shall be included in the "conductor" defined in the present invention even if the electrical resistance of the material exceeds the value range described above.

The present inventors have found that the relation of the angle discrepancy $\theta_z$ and the rotational velocity f as illustrated in FIG. 6 changes depending on the material, shape, and arrangement location of a conductor. For example, when SUS304 (plate thickness of 1 mm) was employed as the material of the non-magnetic conductor, the angle discrepancy at the rotational velocity of 250 Hz was 0.3°. When an aluminum plate was employed, the angle discrepancy for the plate thickness of 3 mm became larger than the angle discrepancy for the plate thickness of 1 mm.

Next, the cause of this angle discrepancy is explained with reference to FIGS. 7(A) and 7(B).

Figure 7A:
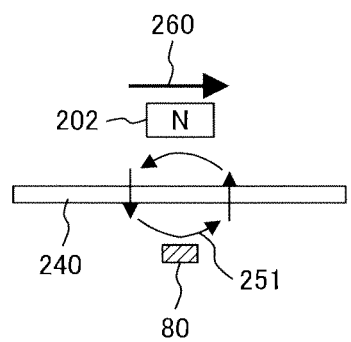
FIG. 7(A) is a side view of a configuration in which a non-magnetic conductor is arranged between a sensor magnet and the rotational angle measurement apparatus.

FIG. 7(A) is a side view of a configuration in which a non-magnetic conductor 240 is arranged between a sensor magnet 202 and a rotational angle measurement apparatus 80. The non-magnetic conductor 240 is an aluminum plate in the experiment described above. FIG. 7(B) is a top view of the arrangement corresponding to FIG. 7(A). The rotation direction of the sensor magnet 202 is indicated by an arrow 260.

In the side view of FIG. 7(A), when the sensor magnet 202 as an magnetic flux generator moves in the direction of the arrow 260, the flux linkage through the non-magnetic conductor 240 changes. Therefore, an eddy current of a direction which cancels the flux change flows in the non-magnetic conductor 240. This eddy current induces an induced magnetic field 251. The direction of the induced magnetic field 251 is the direction to cancel the change of the flux linkage through the conductor, as illustrated in FIG. 7(A).

Figure 7B:
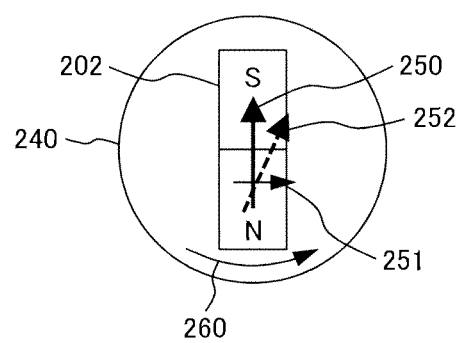
FIG. 7(B) is a top view corresponding to FIG. 7(A)

The angle of the induced magnetic field 251 induced by the eddy current acting at the point of the rotational angle measurement apparatus 80 is as illustrated in FIG. 7(B). Therefore, the rotational angle measurement apparatus 80 detects a combined magnetic field 252 of the magnetic field 250 generated by the sensor magnet 202 and the induced magnetic field 251 induced by the eddy current. As illustrated in FIG. 7(B), the angle of the combined magnetic field 252 deviates from the angle of the magnetic field 250 generated by the sensor magnet 202. For this reason, the angle discrepancy occurs between the angle of the rotatable body 121 and the output angle of the rotational angle measurement apparatus 80.

The magnitude of the induced magnetic field 251 induced by the eddy current becomes larger as the eddy current is larger. The eddy current becomes larger as the degree of temporal difference of the flux linkage with a conductor is larger. Accordingly, the induced magnetic field 251 induced by the eddy current also becomes larger as the rotational velocity of the sensor magnet 202 becomes faster. Therefore, the amount of the angle discrepancy of the output angle of the rotational angle measurement apparatus 80 also becomes larger as the rotational velocity becomes faster.

When the degree of temporal difference of the flux linkage is the same, the eddy current becomes larger as the sheet resistance of the non-magnetic conductor 240 is smaller. A sheet resistance is proportional to the relative resistance of the material and inversely proportional to the plate thickness. Therefore, the material with a smaller relative resistance exhibits a larger angle discrepancy. The cause that an aluminum plate (relative resistance $\rho$ $2.75 \times 10^{-8}$ $\Omega$m) exhibits a larger angle discrepancy than a SUS304 plate (relative resistance $\rho=72 \times 10^{-8}$ $\Omega$m) lies in this point. The angle discrepancy becomes larger as the plate thickness is thicker.

As seen from the mechanism described above, the angle discrepancy of measurement due to the induced magnetic field 251 induced by the eddy current is a problem occurring commonly when the non-magnetic conductor 240 is arranged in the vicinity of the rotational angle measurement apparatus 80. For example, in cases where the sensor magnet 202, the rotational angle measurement apparatus 80, and the non-magnetic conductor 240 are arranged in this order, if the condition that an eddy current is generated in the non-magnetic conductor 240 is satisfied, the angle discrepancy occurs.

The present inventors measured in detail the relation between the angle signal measured by the rotational angle measurement apparatus 80 and the angle of the rotatable body 121, and found that the error of the measured angle lies only in the discrepancy of the angle origin, that is, the discrepancy of the phase angle.

The experimental result by the present inventors described above is summarized as follows.

(1) When a non-magnetic conductor (electrical conductor) is placed in the vicinity of the magnetic sensor, a measurement error is caused at the time of a high speed rotation.

(2) The measurement error is the discrepancy of the angle origin, that is, the discrepancy of the phase angle.

(3) The discrepancy of the angle origin is a function of the rotational velocity.

(4) The function form which expresses the dependence of the discrepancy of the angle origin on the rotational velocity is dependent on the material, shape, and arrangement location of a conductor, at least.

The "vicinity" in (1) is defined as the range within which an error is caused in the measurement value of the rotation angle by the existence of the conductor. In the present specification, the "vicinity" is defined as the range within which the measurement error of 0.1° or more is caused. This is because the error of 0.1° or more is regarded as a significant error in the normal application.

Next, the configuration of the rotational angle measurement apparatus according to the present example is explained with reference to FIG. 1.

The rotational angle measurement apparatus 80 according to the present example is configured with a magnetic sensor 70 and a detection unit 302. A rotatable body 121 provided with a magnetic flux generator (i.e., a sensor magnet) 202 rotates about a rotational axis 226. The rotation angle is defined as $\theta_r$. The rotational angle measurement apparatus 80 measures the rotation angle $\theta_r$ of the rotatable body through the measurement of the angle of magnetic field of the sensor magnet 202.

The magnetic sensor 70 outputs a raw-angle signal set 155. The raw-angle signal set 155 indicates a signal or a signal group which carries the information on the magnetic-field angle detected by the magnetic sensor 70.

The concrete signal form of the raw-angle signal set 155 changes depending on the magnetic sensor 70. For example, in the case of the magnetic sensor which outputs a voltage signal proportional to an angle of magnetic field, the raw-angle signal set 155 is a voltage signal, and it is a scalar. In the case of the magnetic sensor 70 illustrated in FIG. 4, the signal set $(V_{c1}, V_{c2}, V_{s1}, V_{s2})$ is the raw-angle signal set 155. This is because the magnetic-field angle $\theta$ can be calculated by the use of these four signals as shown by Equation 4, Equation 5, and Equation 7. In the case of the magnetic sensor with built-in differential amplifiers 351A and 351B, a signal set $(\Delta V_c, \Delta V_s)$ is the raw-angle signal set 155. This is because the magnetic-field angle $\theta$ can be calculated by the use of Equation 7. In the case of the magnetic sensor which outputs the X component $V_x$ and the Y component $V_y$ of a magnetic field, $(V_x, V_y)$ is the raw-angle signal set 155. This is because the magnetic-field angle can be calculated in terms of a tan 2 $(V_y, V_x)$.

The raw-angle signal set 155 is sometimes a digital signal. For example, in the case of a 12-bit angle output signal for outputting a value of 0 to $2^{12}-1$ corresponding to the angle of 0-360°, the 12-bit angle output signal is the raw-angle signal set 155.

The raw-angle signal set 155 outputted from the magnetic sensor 70 is inputted to the detection unit 302. The raw-angle signal set 155 is converted into a simple angle signal 156 ($\theta_1$) by the angle-calculation unit 311 in the detection unit 302. The simple angle signal 156 ($\theta_1$) is the angle calculated from the raw-angle signal set 155, and corresponds to the angle of magnetic field detected by the magnetic sensor 70.

In the case of the magnetic sensor 70 having the configuration illustrated in FIG. 4, the simple angle signal 156 ($\theta_1$) is $\theta$ expressed by Equation 7.

The angle-calculation unit 311 also calculates rotational velocity 153 ($\omega$) of the rotatable body 121. The rotational velocity 153 ($\omega$) can be calculated from the time difference of the raw-angle signal set 155, or from the time difference of the simple angle signal 156 ($\theta_1$). For example, the rotational velocity w can be calculated by the use of a Kalman filter with two variables of ($\theta_1$, $\omega$) as the state variables.

The rotational velocity 153 ($\omega$) is inputted to the correction unit 320 in the detection unit 302. In the correction unit 320, a correction value for correcting an error caused by the generation of an eddy current is outputted by the use of a suitable correction function. Specifically, the correction unit has a correction function $F_{ed}(\omega)$ with the rotational velocity 153 ($\omega$) as an argument, and outputs a correction value of the angle discrepancy (phase discrepancy) corresponding to the rotational velocity.

An example of the correction function $F_{ed}(\omega)$ is described concretely for the arrangement in which the result of FIG. 6 was obtained. The following expression was employed as the correction function in this arrangement.

$$F_{ed}(\omega)=0.021\omega \qquad \text{[Equation 8]}$$

Here, the rotational velocity a is a value expressed in units of Hz, that is, the number of rotation per second.

In the example described above, a linear function is employed as the correction function $F_{ed}(\omega)$; however, the correction function of the present invention is not necessarily restricted to the linear function. It is also preferable to employ a polynomial of the second or higher order, or a look-up table expressing correspondence of the rotational velocity $\omega$ and the correction value.

A value of the simple angle signal 156 ($\theta_1$) corrected with the use of the correction function $F_{ed}(\omega)$ is outputted to the angle-output terminal 90 as the corrected angle signal 151 ($\theta_2$). Specifically, the corrected angle signal 151 ($\theta_2$) is obtained by adding a correction value given by the correction function $F_{ed}(\omega)$ to the simple angle signal 156 ($\theta_1$). That is, the mathematical expression is given by Equation 9.

$$\theta_2=\theta_1+F_{ed}(\omega) \qquad \text{[Equation 9]}$$

As described in (2) of the experimental result, the measurement error due to the presence of the non-magnetic conductor 240 is the discrepancy of the angle origin, that is, the phase discrepancy; therefore, the correction function $F_{ed}(\omega)$ does not depend on a value of the rotational angle.

Equation 9 can be rewritten as follows.

$$\theta_2-\theta_1=F_{ed}(\omega) \qquad \text{[Equation 10]}$$

That is, the difference ($\theta_2-\theta_1$) between the corrected angle signal 151 ($\theta_2$) outputted from the angle-output terminal 90 and the simple angle signal 156 ($\theta_1$) obtained from the raw-angle signal set 155 depends on the rotational velocity $\omega$, but does not depend on a value of the rotational angle, i.e., the difference ($\theta_2-\theta_1$) is a value independent of the rotational angle.

Figure 1:
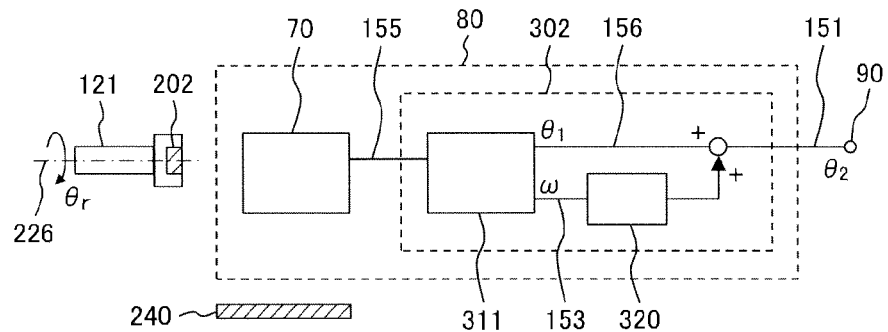
FIG. 1 is a drawing illustrating a configuration of a rotational angle measurement apparatus according to Example 1.
Figure 8:
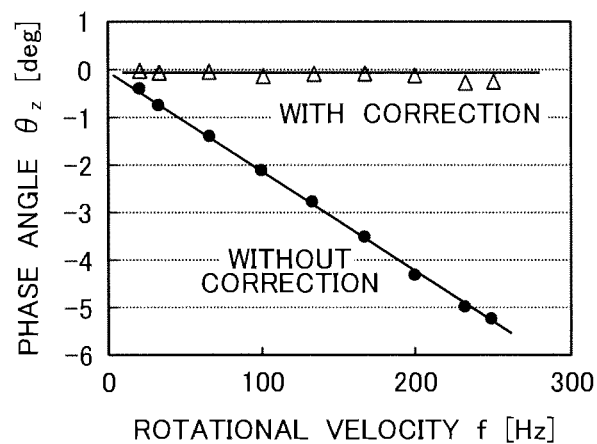
FIG. 8 illustrates an experimental result on the characteristics of the rotational angle measurement apparatus according to Example 1.

FIG. 8 shows the measured value of the measurement error in the case of arranging a 1-mm-thick aluminum plate between the sensor magnet 202 and the rotational angle measurement apparatus 80 in FIG. 5, and employing the configuration illustrated in FIG. 1 as the rotational angle measurement apparatus 80.

In FIG. 8, filled circles show the case of no correction, that is, the case of employing the rotational angle measurement apparatus having the configuration illustrated in FIG. 4. As compared with this, open triangles show the case of employing the rotational angle measurement apparatus 80 having the configuration illustrated in FIG. 1. Equation 8 is employed as the correction function. When the correction function is employed, the measurement error does not occur even at the rotational velocity f of 250 Hz. In this way, when the rotational angle measurement apparatus 80 having the configuration of the present example is employed, it is possible to measure the rotational angle $\theta$ of the rotatable body 121 accurately from a state of rest (0 Hz) to a high speed rotation, even when a conductor of non-magnetic material is placed in the vicinity of the rotational angle measurement apparatus 80. Compared with this, in the past, the configuration in which a non-magnetic conductor 240 is arranged, as a shield as the measures to suppress electrical noise of a magnetic sensor, has posed a problem such that it is difficult to accurately measure the magnetic-field angle (rotational angle), due to the influence of an eddy current when the magnetic flux generator rotates at high speed.

Example 2

Figure 9:
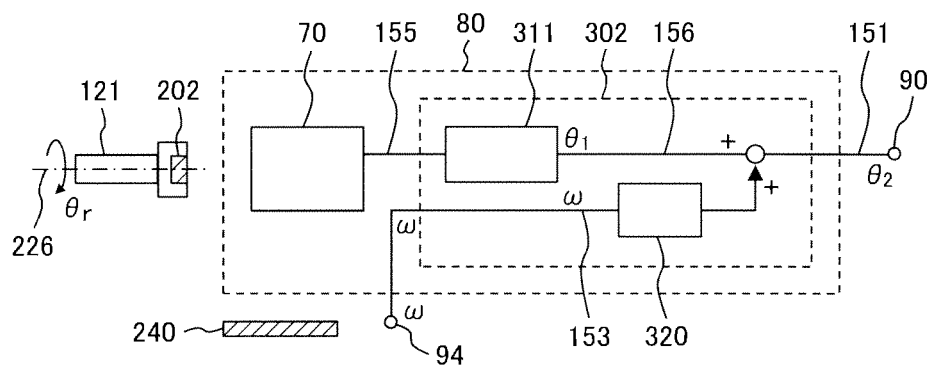
FIG. 9 is a drawing illustrating a configuration of a rotational angle measurement apparatus according to Example 2.

Example 2 according to the present invention is described with reference to FIG. 9. The same reference symbol is attached in the same configuration as in the previous example, and the explanation thereof is omitted.

In the present example, the rotational angle measurement apparatus 80 is provided with a rotational-velocity signal input terminal 94. By inputting a signal corresponding to the rotational velocity of the rotatable body 121 from the rotational-velocity signal input terminal 94, the rotational angle measurement apparatus 80 calculates the correction value corresponding to the rotational velocity 153 ($\omega$) in the correction unit 320, corrects the simple angle signal 156 ($\theta_1$) with the use of the correction value, and outputs the corrected angle signal 151 ($\theta_2$) to the angle-output terminal 90.

In the present example, it is not necessary to calculate the rotational velocity 153 ($\omega$); therefore, there is an advantage that the configuration of the detection unit 302 becomes simple.

Furthermore, when the rotational velocity 153 ($\omega$) is calculated from the time difference of the simple angle signal 156 ($\theta_1$), the system becomes susceptible to a noise of the simple angle signal ($\theta_1$). Such a problem is not produced in the present example.

As for the input signal to the rotational-velocity signal input terminal 94, it is only necessary to input the output signal of the rotational-velocity sensor for measuring the rotational velocity of the rotatable body 121.

As the rotational-velocity sensor, it is preferable to employ a tachometer, etc.

It is also preferable that a signal corresponding to the rotational velocity is outputted from the motor used for rotating the rotatable body 121, and that the signal concerned is inputted to the rotational-velocity signal input terminal 94.

When a direct-current motor is employed as the motor, a motor voltage is proportional to the rotational velocity; therefore, it is possible to employ the motor voltage as the speed signal by performing suitable signal transformation.

Example 3

Example 3 according to the present invention is described with reference to FIG. 10. The same reference symbol is attached in the same configuration as in the previous examples, and the explanation thereof is omitted.

In addition to the configuration illustrated in FIG. 1, a correction-function configuration means 95 is provided in the present example.

As described above, the function form which expresses the dependence of the discrepancy of the angle origin on the rotational velocity is dependent on the material, shape, and arrangement location of a conductor, at least. Therefore, a suitable function form of the correction function is also dependent on the material, shape, and arrangement location of the conductor.

In the rotational angle measurement apparatus 80 according to the present example, the correction-function configuration means 95 is provided; accordingly, it is possible to change the function form of the correction function. Therefore, it is possible to set a suitable correction function, according to the conditions under which the rotational angle measurement apparatus 80 is utilized.

Specifically, the correction-function configuration means 95 can be realized with a communication terminal. In the case of Equation 8 being employed as the correction function, a parameter "+0.021" is inputted to the rotational angle measurement apparatus 80 via the communication terminal 95, and the parameter is stored in the correction unit 320. It is not always necessary to provide an exclusive-use communication terminal in the correction function setup. Alternatively, it is preferable to share a communication terminal provided for setting other parameters. Here, "other parameters" include an offset-correction parameter of the raw-angle signal set 155, for example.

In this way, the present example has an effect on providing a general-purpose rotational angle measurement apparatus 80.

As described above, "the function form of the correction function" described here is restricted to neither a linear function nor a polynomial of the second or higher order, but includes other functions and forms such as a look-up table.

Figure 10:
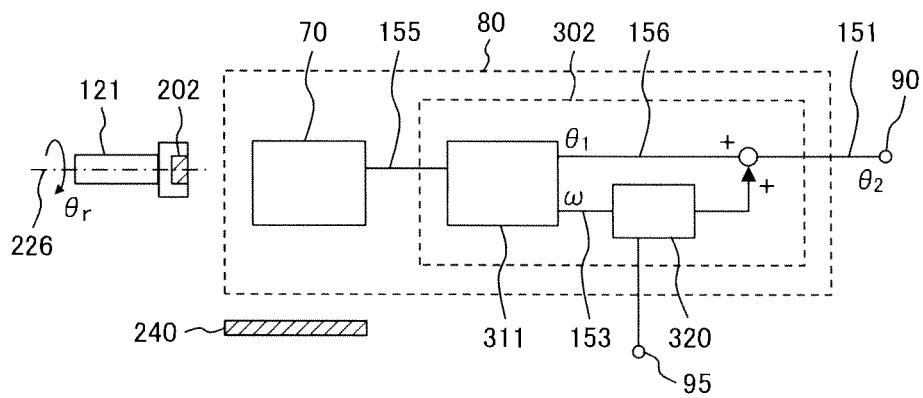
FIG. 10 is a drawing illustrating a configuration of a rotational angle measurement apparatus according to Example 3.

FIG. 10 illustrates the configuration in which the correction-function configuration means 95 is added to the configuration illustrated in FIG. 1. However, the present example is not restricted to the configuration. It is preferable to employ the configuration in which the correction-function configuration means 95 is added to the configuration illustrated in FIG. 9. Such a configuration is also effective in providing a general-purpose rotational angle measurement apparatus 80.

Example 4

Figure 11:
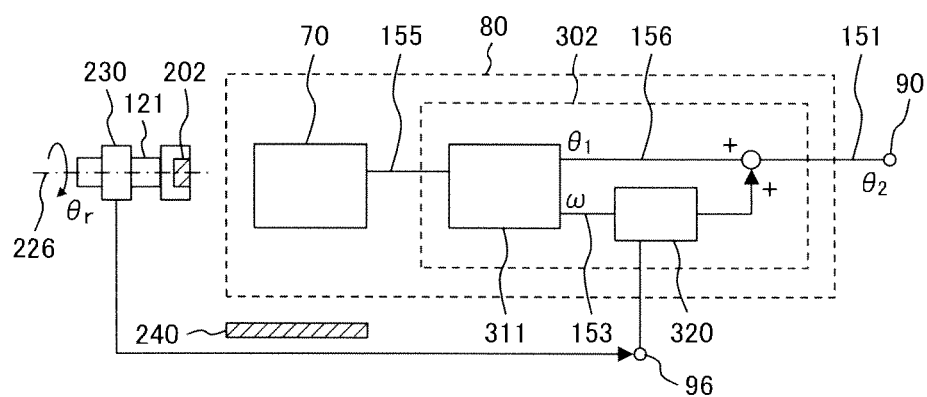
FIG. 11 is a drawing illustrating a configuration of a rotational angle measurement apparatus according to Example 4.

Example 4 according to the present invention is described with reference to FIG. 11. The same reference symbol is attached in the same configuration as in the previous examples, and the explanation thereof is omitted.

In the present example, a reference-position signal input terminal 96 is provided in addition to the configuration illustrated in FIG. 1.

The present example aims at enabling automatic acquisition of a suitable correction function. The following describes the concrete method.

Here, the case where a linear expression is employed as the correction function is described.

A reference-position signal generator 230 is installed in the rotatable body 121. The reference-position signal generator 230 generates a signal when the rotatable body 121 is in a specific angle (reference position). The reference position of the rotatable body may be considered as the origin of rotation of the rotatable body. An example of the specific configuration of the reference-position signal generator 230 is the combination of an optical slit, a light emitting diode, and a light detector, as described in FIG. 5. The signal generated by the reference-position signal generator 230 is inputted to the reference-position signal input terminal 96 of the rotational angle measurement apparatus 80.

Figure 12:
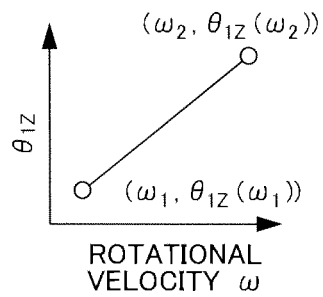
FIG. 12 is a drawing illustrating a correction function in Example 4.

In the present conditions, the rotatable body 121 is rotated at plural rotational velocities $\omega_n$ (n=1, 2, ...), a value of the simple angle $\theta_{1z}(\omega_n)$ is measured at the time when the reference position signal is inputted, and the value is stored. These values are plotted as shown in FIG. 12. In cases where a linear correction function is employed, it is assumed that at two kinds of rotational velocities $\omega_1$ and $\omega_2$, the values of simple angle are $\theta_{1z}(\omega_1)$ and $\theta_{1z}(\omega_2)$. Then the correction function $F_{ed}(\omega)$ can be calculated by the following Equation.

$$F_{ed}(\omega) = -\frac{\theta_{1Z}(\omega_2) - \theta_{1Z}(\omega_1)}{\omega_2 - \omega_1}\omega \qquad \text{[Equation 11]}$$

This equation corresponds to the characteristics of $\theta_z$ vs. rotational velocity f in the case of "no correction" illustrated in FIG. 8, expressed as a function of the rotational velocity $\omega$ and attached with the minus symbol.

When obtaining the linear correction function, it is preferable to measure the simple angle $\theta_{1z}(\omega_n)$ at three or more rotational velocities as shown in FIG. 8, and calculate the correction function by the least square method.

In cases where a polynomial of the second or higher order is employed as the correction function, or in cases where a look-up table is employed, it is clear that the correction function can be obtained by the same method as described above.

In this way, the rotational angle measurement apparatus 80 according to the present example is provided with the reference-position signal input terminal 96, and has an effect on enabling automatic acquisition of the correction function.

Example 5

Figure 13:
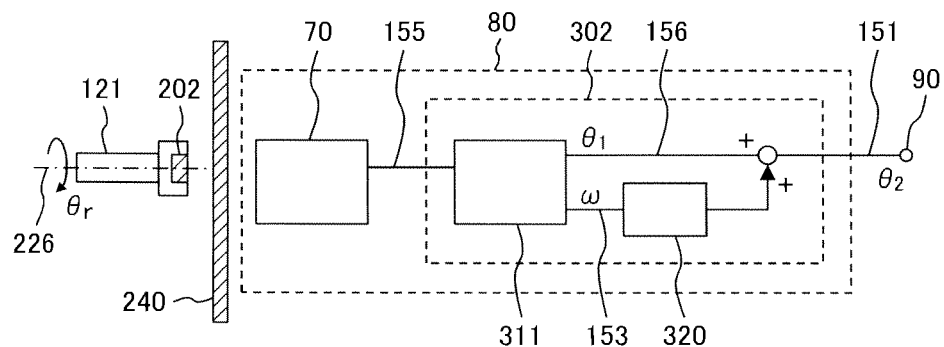
FIG. 13 is a drawing illustrating a configuration of a rotational angle measurement apparatus according to Example 5.

Example 5 according to the present invention is explained with reference to FIG. 13. The same reference symbol is attached in the same configuration as in the previous examples, and the explanation thereof is omitted.

In the present example, a non-magnetic conductor 240 is arranged between the sensor magnet 202 (magnetic flux generator) and the magnetic sensor 70. The configuration of the rotational angle measurement apparatus 80 according to the present example is the same as the configuration illustrated in FIG. 1.

According to the present example, the correction of the error of the induced magnetic field due to an eddy current is performed by the correction unit 320. Therefore, it is possible to measure the rotational angle with a sufficient accuracy even in the arrangement in which the non-magnetic conductor 240 is inserted between the sensor magnet 202 and the magnetic sensor 70, and even when the rotatable body 121 rotates at a high speed revolution.

The advantage of the arrangement placing the non-magnetic conductor 240 between the sensor magnet 202 and the magnetic sensor 70 will be concretely described in an example in which the arrangement is applied to the rotation machine.

Example 6

Figure 14:
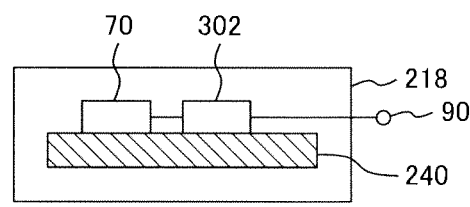
FIG. 14 is a drawing illustrating a configuration of a rotational angle measurement apparatus according to Example 6.

Example 6 according to the present invention is described with reference to FIG. 14. The same reference symbol is attached in the same configuration as in the previous examples, and the explanation thereof is omitted.

The present example relates to a rotational angle measurement apparatus 80 in which a magnetic sensor 70, a detection unit 302, and a non-magnetic conductor 240 are integrated in a package 218. The detection unit 302 employs the configuration illustrated in FIG. 1 or one of the configurations illustrated in FIG. 9 to FIG. 11, or the like.

The package 218 may be resin-molded and integrated to one body, for example.

The angle-output terminal 90 of the detection unit 302 is drawn out to the exterior of the package 218.

In the present example, the non-magnetic conductor 240 is arranged in the vicinity of the magnetic sensor 70 and the detection unit 302; therefore, the configuration has an effect on reducing electrical noise. As for material of the non-magnetic conductor 240, the smaller the relative resistance of the material, the larger the reduction effect of electrical noise. In the present example, copper (relative resistance $\rho=1.7\times10^{-8}$ $\Omega m$) is employed.

In a rotational angle measurement apparatus in the past, in cases where the non-magnetic conductor 240 is arranged in the vicinity of the magnetic sensor 70, when measuring the rotational angle at a high speed rotation, the problem is that a measurement error is caused due to the eddy current generated in the non-magnetic conductor 240, thereby deteriorating the measurement accuracy. This problem is that the degree of measurement accuracy degradation becomes larger as the relative resistance of the material of the non-magnetic conductor 240 is smaller, as described above. According to the present example, the detection unit 302 corrects the influence of an eddy current by the use of the correction function in the correction unit 320; therefore, even the configuration illustrated in FIG. 14 allows the rotational angle measurement to be performed with a high degree of accuracy from a state of rest to a high speed rotation. Therefore, the present example has an effect on expanding the degree of freedom in selecting the material of the non-magnetic conductor 240 for electrical noise reduction.

Example 7

A control apparatus according to Example 7 of the present invention is described with reference to FIG. 15. The same reference symbol is attached in the same configuration as in the previous examples, and the explanation thereof is omitted.

Figure 15:
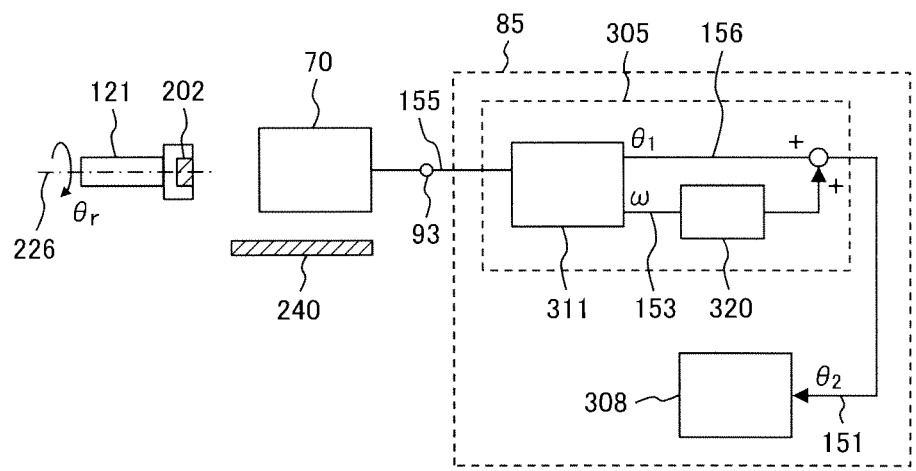
FIG. 15 is a drawing illustrating a configuration of a control apparatus according to Example 7.

A control apparatus 85 according to the present example is employed with a rotatable body 121 provided with a sensor magnet (magnetic flux generator) 202, and a magnetic sensor 70, as illustrated in FIG. 15.

The control apparatus 85 is provided with a raw-angle signal input terminal 93 for inputting an output signal from the magnetic sensor 70 as a raw-angle signal set 155. The control apparatus 85 is configured with a rotational angle calculation unit 305 and a control-processing unit 308.

The rotational angle calculation unit 305 is configured with an angle-calculation unit 311 and a correction unit 320. The raw-angle signal set 155 inputted from the raw-angle signal input terminal 93 is inputted to the angle-calculation unit 311, to calculate a simple angle $\theta_1$. The rotational velocity 153 ($\omega$) is also calculated from a time difference of the raw-angle signal set 155. The rotational velocity 153 ($\omega$) is inputted to the correction unit 320, and a correction value is calculated by the use of a correction function $F_{ed}$ ($\omega$) with the rotational velocity 153 ($\omega$) as an argument. Then, a corrected angle signal 151 ($\theta_2$) is calculated by adding the correction value to the simple angle $\theta_1$, which is then outputted from the rotational angle calculation unit 305.

The corrected angle signal 151 ($\theta_2$) is inputted to the control-processing unit 308, and the control-processing unit 308 performs control processing based on the corrected angle signal 151 ($\theta_2$).

The control processing which the control-processing unit 308 performs may depend on a control target of the control apparatus 85 and includes the following several examples.

In cases where the control apparatus 85 is a controller for controlling the drive of a motor, the rotational angle of the rotatable body 121 is detected on the basis of the corrected angle signal 151 ($\theta_2$), and a motor-voltage-application signal corresponding to the detected rotational angle is outputted to a motor-drive circuit. Accordingly, the control apparatus 85 controls the drive of the motor.

In cases where the control apparatus 85 is a controller for controlling electric power-assisted steering, the state of the steering is detected on the basis of the corrected angle signal 151 ($\theta_2$), and the state of a steering-drive motor is appropriately controlled together with information including the command value in operating the steering wheel, etc.

An example of the control apparatus includes an ECU (electronic controller unit). The ECU is the control apparatus which employs an MPU (Micro-Processor Unit).

Example 8

Figure 16:
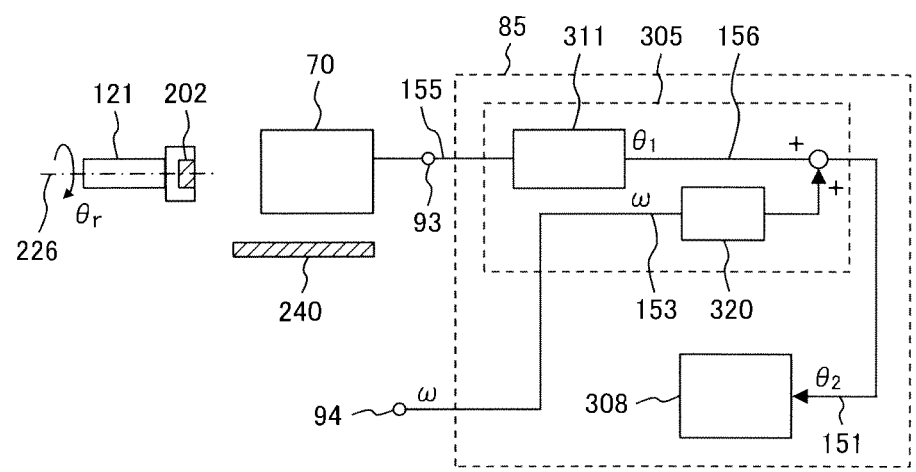
FIG. 16 is a drawing illustrating a configuration of a control apparatus according to Example 8.

Example 8 according to the present invention is described with reference to FIG. 16. The same reference symbol is attached in the same configuration as in the previous examples, and the explanation thereof is omitted.

A control apparatus 85 according to the present example is employed with a rotatable body 121 provided with a sensor magnet (magnetic flux generator) 202, and a magnetic sensor 70.

The control apparatus 85 is provided with a raw-angle signal input terminal 93 for inputting an output signal from the magnetic sensor 70 as a raw-angle signal set 155. The control apparatus 85 is configured with a rotational angle calculation unit 305 and a control-processing unit 308.

The control apparatus 85 is provided with a rotational-velocity signal input terminal 94. A signal of the rotational velocity u inputted to the rotational-velocity signal input terminal 94 is inputted to the correction unit 320 in the rotational angle calculation unit 305. The correction unit 320 calculates a suitable correction value through a correction function $F_{ed}$ ($\omega$) by the use of the value of the rotational velocity $\omega$.

In the present example, the angle-calculation unit 311 does not need to calculate the rotational velocity $\omega$ owing to the configuration, therefore the present example has an effect on simplifying the configuration.

Example 9

Figure 17:
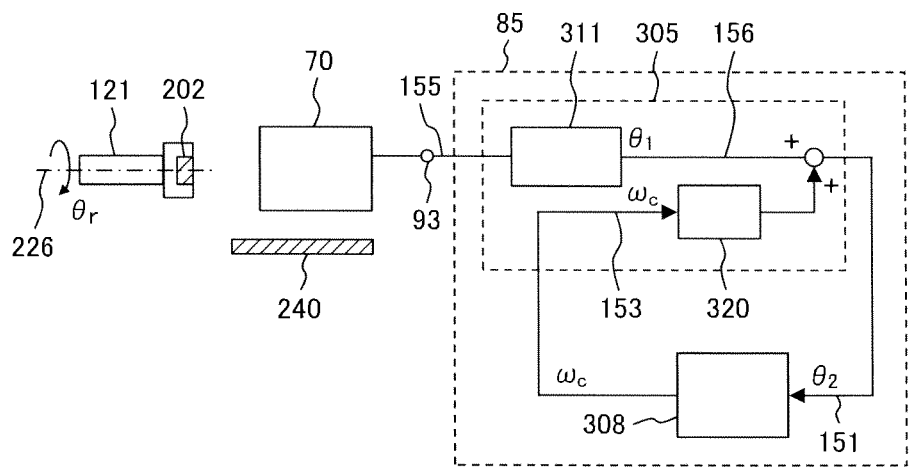
FIG. 17 is a drawing illustrating a configuration of a control apparatus according to Example 9.

Example 9 according to the present invention is described with reference to FIG. 17. The same reference symbol is attached in the same configuration as in the previous examples, and the explanation thereof is omitted.

A control apparatus 85 according to the present example is employed with a rotatable body 121 provided with a sensor magnet (magnetic flux generator) 202, and a magnetic sensor 70.

The control apparatus 85 is provided with a raw-angle signal input terminal 93 for inputting an output signal from the magnetic sensor 70 as a raw-angle signal set 155. The control apparatus 85 is configured with a rotational angle calculation unit 305 and a control-processing unit 308.

In the present example, a velocity command value $\omega_c$ is employed as the rotational velocity 153 to be inputted to the correction unit 320 in the rotational angle calculation unit 305. The velocity command value $\omega_c$ is outputted from the control-processing unit 308.

The velocity command value $\omega_c$ is a setting value of a target value of rotational velocity, in cases where the control apparatus 85 performs control processing of a rotation machine. Since the control-processing unit 308 has the velocity command value $\omega_c$, it is possible to employ the signal.

According to the configuration of the present example, the speed calculation processing is not only unnecessary in the angle-calculation unit 311, but inputting of a speed signal from the exterior is also unnecessary. Therefore, the present example has an effect on simplifying the configuration of the control apparatus 85.

Example 10

Example 10 according to the present invention is described with reference to FIG. 18. The same reference symbol is attached in the same configuration as in the previous examples, and the explanation thereof is omitted.

A control apparatus 85 according to the present example is employed with a rotatable body 121 provided with a sensor magnet (magnetic flux generator) 202, and a magnetic sensor 70.

The control apparatus 85 is provided with a raw-angle signal input terminal 93 for inputting an output signal from the magnetic sensor 70 as a raw-angle signal set 155. The control apparatus 85 is configured with a rotational angle calculation unit 305 and a control-processing unit 308.

The control apparatus 85 according to the present example is provided with a correction-function configuration means 95.

As described above, the function form which expresses the dependence of the discrepancy of the angle origin on the rotational velocity is dependent on the material, shape, and arrangement location of a conductor, at least. Therefore, a suitable function form of the correction function is also dependent on the material, shape, and location of the conductor.

In the control apparatus 85 according to the present example, the correction-function configuration means 95 is provided; accordingly, it is possible to change the function form of the correction function. Therefore, it is possible to set a suitable correction function, according to the conditions under which the control apparatus 85 is employed.

Specifically, it is possible to realize the correction-function configuration means 95 with a communication terminal. In the case of Equation 8 being employed as the correction function, a parameter "+0.021" is inputted to the control apparatus 85 via the communication terminal 95, and the parameter is stored in the correction unit 320. It is not always necessary to provide an exclusive-use communication terminal in the correction function setup. Alternatively, it is preferable to share a communication terminal provided for setting other parameters. Here, "other parameters" include an offset-correction parameter of the raw-angle signal set 155, for example.

In this way, the present example has an effect on providing a general-purpose control apparatus 85.

As described above, "the function form of the correction function" described here is restricted to neither a linear function nor a polynomial of the second or higher order, but includes other functions and forms such as a look-up table.

Figure 18:
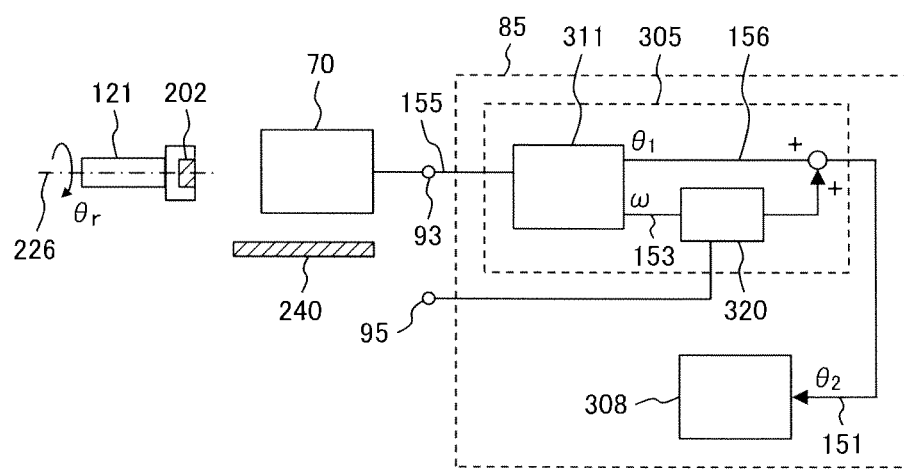
FIG. 18 is a drawing illustrating a configuration of a control apparatus according to Example 10.

FIG. 18 illustrates the configuration in which the correction-function configuration means 95 is added to the configuration illustrated in FIG. 15. However, the present example is not restricted to the configuration. It is preferable to employ the configuration in which the correction-function configuration means 95 is added to the configuration illustrated in FIG. 16 or FIG. 17. Such a configuration is also effective in providing a general-purpose control apparatus 85.

Example 11

Figure 19:
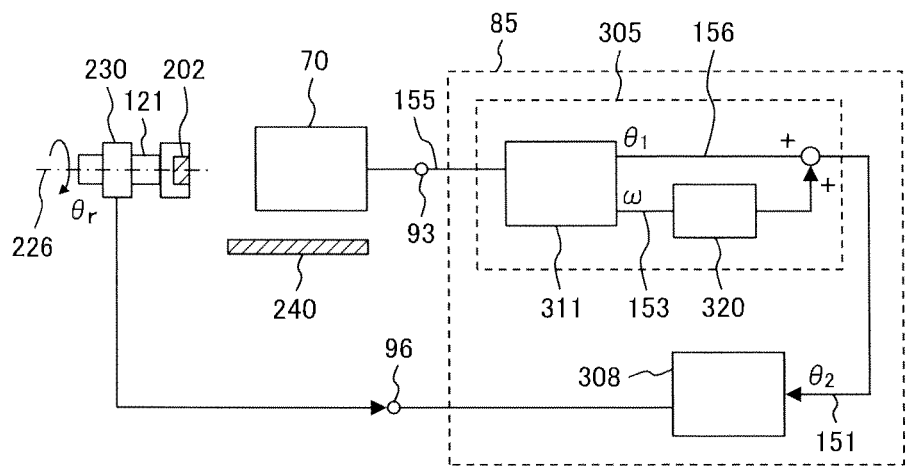
FIG. 19 is a drawing illustrating a configuration of a control apparatus according to Example 11.

Example 11 according to the present invention is described with reference to FIG. 19. The same reference symbol is attached in the same configuration as in the previous examples, and the explanation thereof is omitted.

In the present example, a reference-position signal input terminal 96 is provided in addition to the configuration illustrated in FIG. 15.

The present example aims at enabling automatic acquisition of a suitable correction function. The method of acquiring the correction function automatically is the same as the method employed by the rotational angle measurement apparatus 80 of the configuration of FIG. 11 described in Example 4.

In this way, the control apparatus 85 according to the present example is provided with the reference-position signal input terminal 96, and has an effect on enabling automatic acquisition of the correction function.

Example 12

Figure 20:
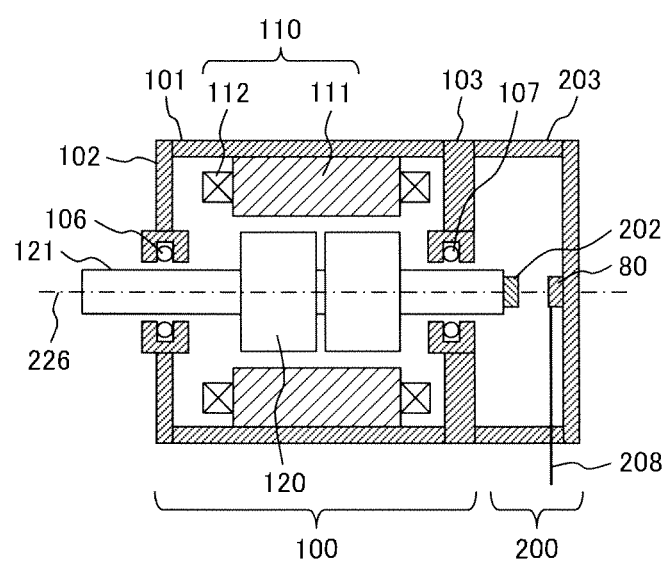
FIG. 20 is a drawing illustrating a configuration of a rotation machine according to Example 12.

A rotation machine which employs a rotational angle measurement apparatus is described as Example 12 of the present invention with reference to FIG. 20. In the present specification, "the rotation machine" includes not only a motor but also "a generator", that is, a machine which converts mechanical energy into electrical energy.

FIG. 20 illustrates a sectional view of the rotation machine according to the present example. The rotation machine according to the present example is configured with a motor unit 100 and a rotational-angle detection unit 200.

The motor unit 100 generates a rotational torque, when plural rotatable magnetic poles rotate by the magnetic interaction between plural fixed magnetic poles and plural rotatable magnetic poles. The motor unit 100 is configured with a stator 110 constituting plural fixed magnetic poles and a rotor 120 constituting plural rotatable magnetic poles. The stator 110 is configured with a stator core 111 and a stator coil 112 equipped to the stator core 111. The rotor 120 is arranged oppositely to the inner circumference of the stator 110 via an air-gap, and is rotatably supported. In the present example, a permanent magnet three-phase AC synchronous motor is employed as the configuration of the motor.

A case is configured with a cylindrical frame 101, and a first bracket 102 and a second bracket 103 which are provided in both axial ends of the frame 101. A bearing 106 is provided in the inner space of the first bracket 101, and a bearing 107 is provided in the inner space of the second bracket 103, respectively. These bearings support the rotatable body 121 rotatably.

A sealant (not shown) is provided between the frame 101 and the first bracket 102. The sealant is an O ring arranged annularly, and is pinched and compressed by the frame 101 and the first bracket 102, in the axial direction and in the diameter direction. According to the devisal, the space between the frame 101 and the first brackets 102 can be sealed, and the front side can be waterproofed. The space between the frame 101 and the second brackets 103 is also waterproofed by the sealant (not shown).

The stator 110 is configured with a stator core 111 and a stator coil 112 equipped to the stator core 111, and is installed in the inner circumference side of the frame 101. The stator core 111 is the magnetic material (magnetic path formation body) which is formed by laminating plural silicon steel sheets in the axial direction. The stator core 111 is configured with a ring-shaped back-core and plural teeth which are arranged at equal intervals in the circumferential direction, projecting from the inner periphery of the back-core to the inner side in the diameter direction.

Each of the plural teeth is intensively wounded with a winding conductor of the stator coil 112. Plural winding conductors are electrically connected for each phase by a connection member juxtaposed in the axial end of one coil end part (on the side of the second bracket 103) of the stator coil 112. The plural winding conductors are further electrically connected so as to establish a three phase winding. The connection systems of the three phase winding include $\Delta$ (delta) connection system and a Y (star) connection system. The $\Delta$ (delta) connection system is adopted in the present example.

The rotor 120 is configured with a rotor core fixed on the outer circumferential surface of the rotatable body 121, and a magnet (the rotor core and the magnet are not shown). In a surface permanent magnet motor, plural magnets are arranged on the surface of the rotor core. In an interior permanent magnet motor, a magnet is buried in the interior of the rotor core. The interior permanent magnet motor is employed in the present example.

Next, a configuration of the rotational-angle detection unit 200 is explained.

The rotational-angle detection unit 200 is configured with a rotational angle measurement apparatus 80 (hereinafter called a rotation sensor module 201) and a sensor magnet 202. The rotation sensor module 201 employs the rotational angle measurement apparatus 80 according to Example 1 of the present invention. The rotational-angle detection unit 200 is installed in the space surrounded by the housing 203 and the second bracket 103. The sensor magnet 202 is installed on the shaft which rotates in a manner interlocked with the rotatable body 121. When the rotatable body 121 changes a rotational position, the magnetic-field angle generated changes correspondingly. The rotational angle (rotational position) of the rotatable body 121 can be measured by detecting this magnetic-field angle by the rotation sensor module 201.

When the rotation sensor module 201 is installed so that a magnetic sensor 70 of the rotation sensor module 201 may be arranged on a rotational axis 226 of the rotatable body 121, an error decreases in the spatial distribution of magnetic field which the sensor magnet 202 generates. Therefore, a preferable arrangement is realized.

It is preferable that the sensor magnet 202 is a two-pole magnet magnetized in two-pole form or a multi-pole magnet magnetized in four-or-more-pole form.

The rotation sensor module 201 is installed in the housing 203. It is preferable that the housing 203 employs a non-magnetic conductor, such as an aluminum and brass, so that the direction of magnetic flux may not be affected. Aluminum is adopted for the housing 203 in the present example.

Since the non-magnetic conductor is installed as the housing 203 in the vicinity of the magnetic sensor 70 of the rotational angle measurement apparatus 80 in this way, an induced magnetic field due to an eddy current will be generated when the rotatable body 121 rotates at high speed. That is, an eddy current is generated in the housing 203 and an induced magnetic field is induced by the eddy current.

In the past, a non-magnetic conductor is installed in the vicinity of the magnetic sensor 70; therefore, due to the influence of the induced magnetic field induced by an eddy current, the measurement accuracy of the rotational angle has deteriorated when the rotatable body 121 rotates at high speed. Alternatively, in order to prevent such deterioration, non-conductive material, such as resin, has been needed to be employed for a part of the housing 203 in the vicinity of the rotational angle measurement apparatus 80.

However, in the present example, the rotation sensor module 201 (the rotational angle measurement apparatus 80) employs the rotational angle measurement apparatus 80 according to Example 1 of the present invention, and accordingly, the measurement error due to an eddy current is corrected and it is possible to measure the rotational angle with a high degree of accuracy in the range from a zero speed to a high speed rotation.

The rotation sensor module 201 need only be fixed with respect to the motor unit, and it does not matter naturally even if it is fixed to components except for the housing 203. The reason is as follows: if the rotation sensor module 201 is fixed with respect to the motor unit 100, when the rotational angle of the rotatable body 121 changes and the direction of the sensor magnet 202 changes, it becomes possible to detect the rotational angle of the rotatable body 121 by detecting the change of the magnetic-field angle at the rotation sensor module 201.

A signal-output wiring 208 is coupled to the rotation sensor module 201. The output signal of the rotation sensor module 201 is transmitted through the signal-output wiring 208.

Example 13

Example 13 according to the present invention is described with reference to FIG. 21. The same reference symbol is attached in the same configuration as in the previous examples, and the explanation thereof is omitted.

In the present example, the rotational angle measurement apparatus 80 according to Example 1 for example is installed in the exterior of the housing 203. The housing 203 is formed with the non-magnetic conductor (electrical conductor) 240. In the present example, aluminum is employed as the material of the housing 203. That is, in the present configuration, the non-magnetic conductor 240 is arranged between the sensor magnet 202 (magnetic flux generator) and the magnetic sensor 70.

When the rotational angle measurement apparatus 80 is installed in the exterior of the housing 203 of the rotation machine in this way, it is possible to obtain an effect on simplifying the installation of the rotational angle measurement apparatus 80. Another effect is that the exchange of the rotational angle measurement apparatus 80 becomes also easy.

When the rotational angle measurement apparatus 80 is installed in the exterior of the housing 203 of the rotation machine, installation of the signal-output wiring 208 of the rotational angle measurement apparatus 80 becomes also easy. When the rotational angle measurement apparatus 80 is installed in the interior of the housing 203, it is necessary to bore an extraction hole through the housing 203 in order to bring the signal-output wiring 208 outside. However, when the rotational angle measurement apparatus 80 is installed in the exterior, there is no need for it. In particular, when manufacturing the rotation machine having waterproof structure, the waterproof structure around the wiring extraction hole becomes complicated; accordingly, there is an effect on simplifying this point. In this way, in rotation machines, such as a motor and a generator, there has been the demand of installing the rotatable body provided with the magnetic flux generator in a metal case.

However, as described above, if such a configuration is adopted in the past, due to the influence of the induced magnetic field induced by an eddy current, the measurement accuracy of the rotational angle has deteriorated when the rotatable body 121 rotates at high speed. Alternatively, in order to prevent such deterioration, non-conductive material, such as resin, has been needed to be employed for a part of the housing 203 between the sensor magnet 202 and the rotational angle measurement apparatus 80.

In the present example, the rotation sensor module 201 (the rotational angle measurement apparatus 80) employs the rotational angle measurement apparatus according to Example 1 of the present invention. Therefore, the measurement error due to an eddy current is corrected and it is possible to measure the rotational angle with a high degree of accuracy in the range from a zero speed to a high speed rotation.

In this way, according to the present invention, even in the configuration in which the rotatable body provided with the magnetic flux generator is installed in the metal case, it is possible to measure the rotational angle of the rotatable body from the exterior of the case, with a high degree of accuracy.

Example 14

Figure 22:
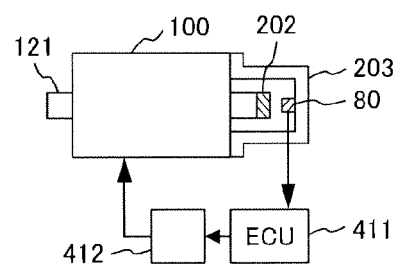
FIG. 22 is a drawing illustrating a configuration of a rotation-machine system according to Example 14.

A rotation-machine system is described as Example 14 of the present invention with reference to FIG. 22.

The rotation-machine system according to the present example is configured with a rotation machine 100, a sensor magnet (magnetic flux generator) 202, a rotational angle measurement apparatus 80, a housing 203, an electronic controller unit (ECU) 411, and a rotation-machine drive unit 412.

By means of the rotational angle measurement apparatus 80, the rotational angle of the rotor (rotatable body) 121 of the rotation machine 100 is measured with a sufficient accuracy. The electronic controller unit 411 controls the rotation-machine drive unit 412 appropriately using the information on the rotational angle, and eventually controls the operation of the rotation machine 100.

The non-magnetic conductor is employed for the housing 203 in the present example. Therefore, when the rotor 121 rotates at high speed, an eddy current is generated in the housing 203 and an induced magnetic field is induced.

The rotational angle measurement apparatus 80 according to the present example has the configuration illustrated in FIG. 1. Therefore, even if an eddy current is generated in the rotation-machine system of the present example, it is possible to measure the rotational angle correctly with the use of the correction function.

Example 15

Figure 23:
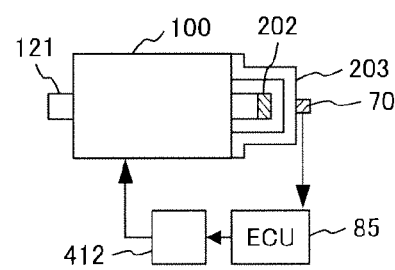
FIG. 23 is a drawing illustrating a configuration of a rotation-machine system according to Example 15.

A rotation-machine system is described as Example 15 of the present invention with reference to FIG. 23.

The rotation-machine system of the present example is configured with a rotation machine 100, a sensor magnet (magnetic flux generator) 202, a magnetic sensor 70, a housing 203, a control apparatus (ECU) 85, and a rotation-machine drive unit 412. The configuration of the control apparatus 85 is the same as the configuration illustrated in FIG. 15.

The magnetic sensor 70 outputs a raw-angle signal set 155 corresponding to an angle of magnetic field. The raw-angle signal set 155 outputted is inputted to the raw-angle signal input terminal 93 of the control apparatus 85. As described in the explanation of FIG. 15, the control apparatus illustrated in FIG. 15 outputs the corrected angle after the influence of an eddy current is corrected, even when the sensor magnet 202 rotates at high speed. Therefore, within the control apparatus 85, it is possible to calculate the rotational angle of the rotor (rotatable body) 121 of the rotation machine 100 with a sufficient accuracy.

On the basis of this corrected angle, the control-processing unit 308 of the control apparatus 85 controls the rotation-machine drive unit 412 appropriately, and eventually controls the operation of the rotation machine 100.

The non-magnetic conductor is employed for the housing 203 in the present example. Therefore, when the rotatable body 121 rotates at high speed, an eddy current is generated in the housing 203 and an induced magnetic field is induced. However, as described above, according to the present example, in the rotation-machine system employing the magnetic sensor 70 without the correction function to an eddy current, it is possible to perform a highly accurate control even at a high speed rotation, by performing a suitable correction with the control apparatus 85.

Example 16

Figure 24:
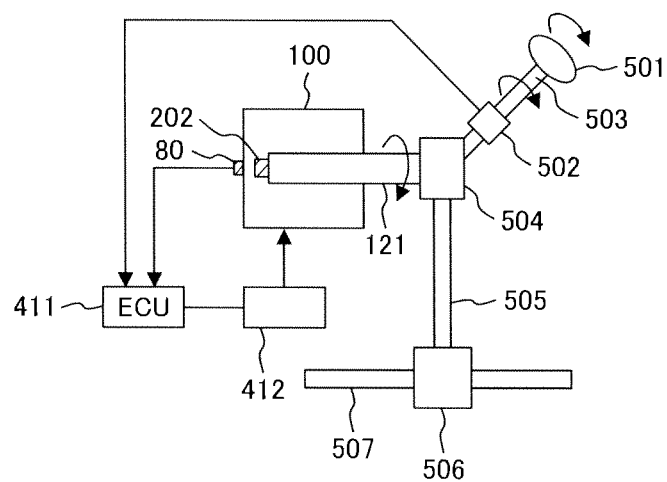
FIG. 24 is a drawing illustrating a configuration of an electric power-assisted steering apparatus according to Example 16.

An example of the electric power-assisted steering system as Example 16 according to the present invention is illustrated in FIG. 24.

A steering shaft 503 mechanically connected to a steering wheel 501 is connected to a joint unit 504 via a torque sensor 502. A rotatable body 121 of a motor 100 is connected to the joint unit 504 configured with a reduction gear, etc. A joint shaft 505 is connected to the joint unit 504. The joint shaft 505 is connected to a gear box 506. A tie rod 507 is connected to the gear box 506. The gear box 506 converts a rotational motion of the joint shaft 505 into a linear motion of the tie rod 507. Tires (not shown) are arranged in both ends of the tie rod 507, and direction of the tires changes corresponding to the linear motion of the tie rod.

The rotatable body 121 is a rotation shaft of the rotation machine (motor) 100, and a sensor magnet 202 is installed at one end. A rotational angle measurement apparatus 80 is installed in the vicinity of the sensor magnet 202, and a rotational angle of the rotatable body 121 is measured and transmitted to an ECU 411. The rotational angle measurement apparatus 80 employs the rotational angle measurement apparatus 80 according to Example 1 of the present invention, of which the configuration is illustrated in FIG. 1.

When a driver turns the steering wheel 501, its rotation state is detected by the torque sensor 502, and transmitted to the ECU 411 as an electrical signal. The ECU 411 calculates a suitable amount of motor drive on the basis of a signal from the torque sensor 502, a rotational angle signal θ from the rotational angle measurement apparatus 80, a vehicle velocity signal, etc., and transmits a signal to a motor-drive unit 412. Accordingly, the motor 100 rotates the rotatable body 121 and assists the rotation of the joint shaft 505. In this way, the movement to move the direction of the tire is assisted.

In the present example, the rotational angle measurement apparatus 80 employs the configuration illustrated in FIG. 1. Therefore, it is possible to measure the rotational angle correctly, even when a non-magnetic conductor is placed in the vicinity of the rotational angle measurement apparatus 80.

When the rotational angle measurement apparatus 80 is installed in the exterior of the housing of the motor 100, there is an effect on simplifying the configuration, in the case of manufacturing the motor 100 of waterproof structure in particular.

Example 17

Example 17 according to the present invention is explained with reference to FIG. 25. The present example is an example of a hybrid vehicle propulsion apparatus (electric vehicle driving apparatus) which employs the rotational angle measurement apparatus.

Figure 25:
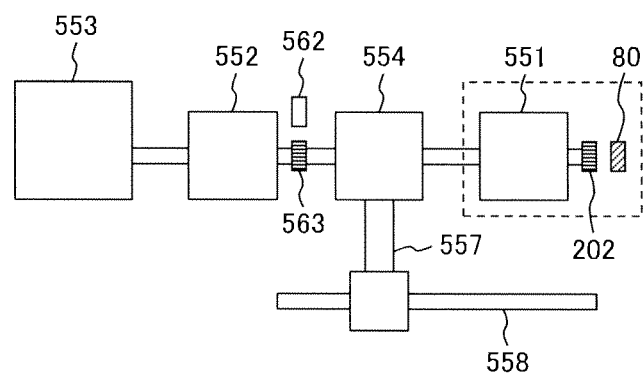
FIG. 25 is a drawing illustrating a configuration of an electric vehicle driving apparatus according to Example 17.

FIG. 25 illustrates a schematic diagram of the hybrid vehicle propulsion apparatus (electric vehicle driving apparatus) which combines an internal combustion engine and an electric motor as the power of a vehicle. An output rotation shaft of an engine 553, and a generator 552 and a drive motor 551 are arranged coaxially, and each transmits power appropriately by the action of a power-splitting mechanism 554. The method of power splitting is appropriately set up on the basis of information, including the running state of a vehicle, a state of acceleration command, a state-of-charge of batteries, and others. A power-transmission mechanism 557 which transmits power to a power shaft 558 from the power-splitting mechanism 554 is provided.

Figure 21:
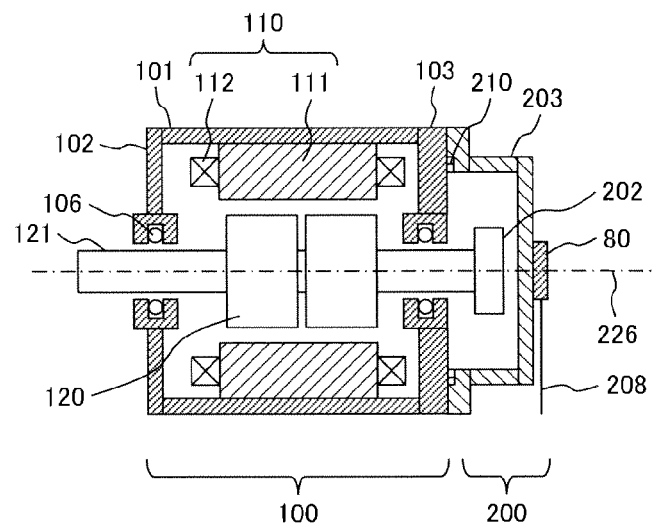
FIG. 21 is a drawing illustrating a configuration of a rotation machine according to Example 13.

The drive motor 551 employs the rotation machine described in FIG. 21. The drive motor 551 is configured with a motor unit 100 and a rotational-angle detection unit 200, as illustrated in FIG. 21. The rotational-angle detection unit 200 is configured with a sensor magnet 202 (magnetic flux generator) and a rotational angle measurement apparatus 80. The configuration of the rotational angle measurement apparatus 80 is the same as the configuration illustrated in FIG. 1.

The rotational angle measurement apparatus 80 is installed in the exterior of a housing 203 which forms a part of a case of the drive motor 551. The non-magnetic conductor is employed for the housing 203. Aluminum is employed in the present example.

A generator rotational sensor 562 is installed in the generator 552. A sensor magnet 563 is installed on a rotation shaft of the generator, and the angle of magnetic field generated by the sensor magnet 563 is measured by the generator rotational sensor 562. The generator rotational sensor 562 employs the rotational angle measurement apparatus 80 illustrated in FIG. 1.

The rotation machine (the drive motor 551 and the generator 552) employed by the electric vehicle driving apparatus is used even at the high speed rotation of about 15000 rpm (250 Hz). Therefore, in the past, when a non-magnetic conductor was placed in the vicinity of the rotational angle measurement apparatus 80, there was a problem that the measurement accuracy of the rotational angle deteriorated at a high speed rotation. According to the present example, it is possible to measure the rotational angle with a sufficient accuracy even at a high speed rotation, by correcting the influence of an eddy current in a non-magnetic conductor. In this way, also in the electric vehicle driving apparatus for which the operation at the high speed rotation of 250 Hz is required, the present example has an effect that it is possible to measure the rotational angle with a sufficient accuracy even at a high speed rotation.

In the present example, as illustrated in FIG. 21, the rotational angle measurement apparatus 80 is installed in the exterior of the housing 203 which forms the rotation machine case. When installed in the exterior of the rotation machine case, there are the following two advantages.

First, in the high-power rotation machine, such as an electric vehicle driving apparatus, oil is put in the rotation machine case for the purpose of cooling, etc. Therefore, in the configuration in which the rotational angle measurement apparatus 80 is installed in the interior of a case, there are restrictions that the material which is resistant to oil must be employed as the rotational angle measurement apparatus 80. When installed in the exterior of the case, there is an effect that such restrictions are removed.

Second, in a high-power rotation machine, such as an electric vehicle driving apparatus, a rotation machine is heated to a high temperature under operating conditions, exposed to heat generated by the stator and rotor of the rotation machine due to a copper loss and an iron loss. However, the heat generation factor is mainly in the interior of the rotation machine; accordingly, temperature in the exterior of the rotation machine case is lower than in the interior. Depending on the design of the rotation machine, this difference of temperature is roughly from 10 to 50° C. Therefore, when the rotational angle measurement apparatus 80 is installed in the exterior of the rotation machine case, there is an effect that it is possible to make it operate at low temperature compared with the case where it is installed in the interior.

Example 18

Example 18 according to the present invention is explained with reference to FIG. 26. The present example is an example of the electric vehicle driving apparatus which employs the control apparatus according to the present invention. The same reference symbol is attached in the same configuration as in the previous examples, and the explanation thereof is omitted.

Figure 26:
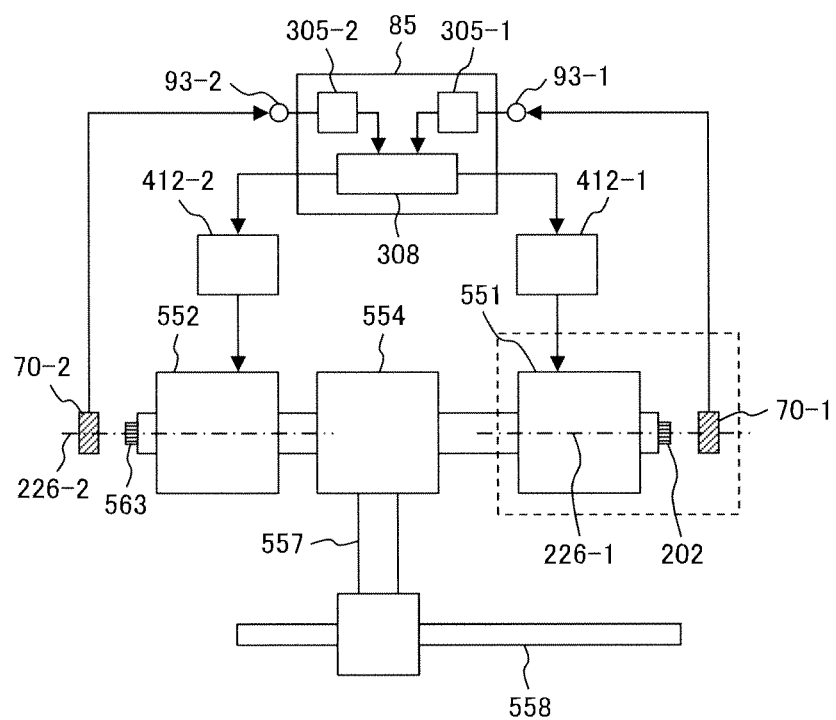
FIG. 26 is a drawing illustrating a configuration of an electric vehicle driving apparatus according to Example 18.

FIG. 26 illustrates a schematic diagram of an electric vehicle driving apparatus which employs an electric motor for the power of a vehicle. A drive motor 551 and a generator 552 are arranged coaxially, and each transmits power appropriately by the action of a power-splitting mechanism 554. The method of power splitting is appropriately set up on the basis of information, including the running state of a vehicle, a state of acceleration command, a state-of-charge of batteries, and others. A power-transmission mechanism 557 which transmits power to a power shaft 558 from the power-splitting mechanism 554 is provided.

The drive motor 551 employs the rotation machine described in FIG. 20 of the present invention. The drive motor 551 is configured with a motor unit 100 and a rotational-angle detection unit 200, as illustrated in FIG. 20. The rotational-angle detection unit 200 is configured with a sensor magnet 202 (magnetic flux generator) and a magnetic sensor 70. The magnetic sensor 70-1 responds to an angle of magnetic field, and outputs a raw-angle signal set corresponding to the angle of magnetic field.

A generator magnetic sensor 70-2 is installed in the generator 552. A sensor magnet 563 is installed on the rotation shaft of the generator. The generator magnetic sensor 70-2 detects the angle of magnetic field generated by the sensor magnet 563 and outputs a raw-angle signal set.

The raw-angle signal set outputted from the magnetic sensor 70-1 and the generator magnetic sensor 70-2 is inputted to raw-angle signal input terminals 93-1 and 93-2 of a control apparatus 85 (ECU), respectively.

The configuration of the control apparatus 85 is the same as the configuration illustrated in FIG. 15. However, the control apparatus 85 according to the present example has two systems of a rotational angle calculation units 305; a raw-angle signal set from the magnetic sensor 70-1 is inputted to a rotational angle calculation unit 305-1, and a raw-angle signal set from the generator magnetic sensor 70-2 is inputted to a rotational angle calculation unit 305-2, respectively. The corrected angle signals outputted from the two system of the rotational angle calculation units 305-1 and 305-2 are inputted to a control-processing unit 308.

On the basis of two corrected angle signals, the control-processing unit 308 detects the rotation state of two rotation machines (the drive motor 551 and the generator 552), and outputs suitable signals to the rotation-machine drive units 412-1 and 412-2 of the respective rotation machines. Accordingly, two rotation machines perform coordination operation. In this way, it is possible to realize the electric vehicle driving apparatus which achieves suitable conditions.

The control apparatus 85 employed in the present example has a function for correcting the measurement error due to an eddy current. Therefore, even if a non-magnetic conductor is placed in the vicinity of the magnetic sensor 70-1 or the generator magnetic sensor 70-2, it is possible to measure the rotational angle of each rotation machine with a sufficient accuracy from a zero speed to a high speed rotation of 15000 rpm (250 Hz).

It is preferable to install the magnetic sensor 70-1 or the generator magnetic sensor 70-2 in the exterior of the cases of the corresponding rotation machines, respectively.

In the above, the example in which the magnetic sensor with a GMR element is employed has been described.

The present invention is not restricted to the magnetic sensor with a GMR element, but can be applied to a magnetic sensor of other magnetic-field-measurement types.

REFERENCE SIGNS LIST

51, 52 GMR element,
60 COS bridge,
61 SIN bridge,
70 magnetic sensor,
80 rotational angle measurement apparatus,
85 control apparatus,
90 angle-output terminal,
94 rotational-velocity signal input terminal,
95 correction-function configuration means,
96 reference-position signal input terminal,
93 raw-angle signal input terminal,
100 motor unit (rotation machine),
110 stator,
111 stator core,
112 stator coil,
120 rotor,
121 rotatable body,
151 corrected angle signal,
153 rotational velocity,
155 raw-angle signal set,
156 simple angle signal,
200 rotational-angle detection unit,
202, 563 sensor magnet,
226 rotational axis,
302 detection unit,
303 signal processing unit,
305 rotational angle calculation unit,
308 control-processing unit,
311 angle-calculation unit,
320 correction unit,
351 differential amplifier,
411 electronic controller unit,
412 rotation machine (motor) driving unit,
501 steering wheel,
502 torque sensor,
503 steering shaft,
504 joint unit,
505 joint shaft,
506 gear box,
507 tie rod,
551 drive motor,
552 generator,
553 engine,
554 power-splitting mechanism,
557 power-transmission mechanisms,
558 power shaft.

The invention claimed is:

1. A rotational angle measurement apparatus comprising:
   a magnetic sensor operable to respond to a magnetic-field angle; and
   a detection unit operable to input an output of the magnetic sensor,
   wherein the rotational angle measurement apparatus is employed with a rotatable body provided with a magnetic flux generator,
   wherein the output of the magnetic sensor is a raw-angle signal set corresponding to the magnetic-field angle, and
   wherein the detection unit outputs a corrected angle after the influence of a non-magnetic conductor arranged in the vicinity of the magnetic sensor is corrected, with the use of a correction value outputted by a correction function with rotational velocity of the rotatable body as an argument.

2. The rotational angle measurement apparatus according to claim 1,
   wherein the corrected angle is obtained by adding the correction value to a simple angle calculated from the raw-angle signal set, and the correction value is independent of the value of the simple angle.

3. The rotational angle measurement apparatus according to claim 2,
   wherein the rotational velocity is calculated from a time difference of the raw-angle signal set.

4. The rotational angle measurement apparatus according to claim 2 further comprising:
   a rotational-velocity signal input terminal operable to input a signal corresponding to the rotational velocity.

5. The rotational angle measurement apparatus according to claim 4,
   wherein the rotational-velocity signal input terminal inputs an output signal of a second sensor.

6. The rotational angle measurement apparatus according to claim 2 further comprising:
   a correction-function configuration means operable to configure the correction function.

7. The rotational angle measurement apparatus according to claim 2 further comprising:
   a reference-position signal input terminal operable to input a reference position signal generated by the rotatable body and indicative of a reference position of the rotatable body.

8. The rotational angle measurement apparatus according to claim 2,
   wherein the non-magnetic conductor is arranged between the magnetic flux generator and the magnetic sensor.

9. The rotational angle measurement apparatus according to claim 2,
wherein the non-magnetic conductor is arranged in the vicinity of the magnetic sensor and packaged.

10. A rotation machine system comprising:
the rotational angle measurement apparatus according to claim 2;
a rotation machine provided with the rotatable body;
a magnetic flux generator operable to rotate in a manner interlocked with the rotatable body;
a rotation-machine drive circuit; and
a control apparatus operable to control the rotation-machine drive circuit.

11. An electric power-assisted steering system provided with the rotational angle measurement apparatus according to claim 1.

12. An electric vehicle driving apparatus provided with the rotational angle measurement apparatus according to claim 1.

13. A control apparatus comprising:
a rotational angle calculation unit operable to input a raw-angle signal set to calculate a corrected angle signal; and
a control unit operable to receive the corrected angle signal,
wherein the control apparatus is employed with a rotatable body provided with a magnetic flux generator, and a magnetic sensor operable to respond to a magnetic-field angle,
wherein the raw-angle signal set is an output signal outputted from the magnetic sensor,
wherein the rotational angle calculation unit outputs a corrected angle after the influence of a non-magnetic conductor arranged in the vicinity of the magnetic sensor is corrected, with the use of a correction value outputted by a correction function with rotational velocity of the rotatable body as an argument, and
wherein the control unit performs processing on the basis of the corrected angle.

14. The control apparatus according to claim 13,
wherein the corrected angle is obtained by adding the correction value to a simple angle calculated from the raw-angle signal set, and the correction value is independent of the value of the simple angle.

15. The control apparatus according to claim 14,
wherein the rotational velocity is calculated from a time difference of the raw-angle signal set.

16. The control apparatus according to claim 14 further comprising:
a rotational-velocity signal input terminal operable to input a signal corresponding to the rotational velocity.

17. The control apparatus according to claim 16,
wherein the rotational-velocity signal input terminal inputs an output signal of a second sensor.

18. The control apparatus according to claim 14 further comprising:
a correction-function configuration means operable to configure the correction function.

19. The control apparatus according to claim 14 further comprising:
a reference-position signal input terminal operable to input a reference position signal generated by the rotatable body and indicative of a reference position of the rotatable body.

20. A rotation machine system comprising:
the control apparatus according to claim 14;
a rotation machine provided with the rotatable body;
a magnetic flux generator operable to rotate in a manner interlocked with the rotatable body;
a magnetic sensor; and
a rotation-machine drive circuit,
wherein a raw-angle signal set outputted by the magnetic sensor is inputted to the control apparatus.

21. A rotation machine system comprising:
the control apparatus according to claim 14;
a rotation machine operable to rotate in a manner interlocked with the rotatable body;
a magnetic sensor; and
a drive circuit operable to derive the rotation machine,
wherein the magnetic sensor detects an angle of magnetic field generated by a magnetic flux generator provided in the rotatable body and outputs a raw-angle signal set, and
wherein the control unit performs control processing to the drive circuit on the basis of the corrected angle.

22. An electric vehicle driving apparatus provided with the control apparatus according to claim 14.

23. The control apparatus according to claim 14,
wherein a velocity command value outputted by the control unit is employed as the rotational velocity.

24. A rotational angle measurement apparatus comprising:
a magnetic sensor operable to respond to a magnetic-field angle; and
a detection unit operable to receive an output of the magnetic sensor,
wherein the rotational angle measurement apparatus is employed with a rotatable body provided with a magnetic flux generator,
wherein the output of the magnetic sensor is a raw-angle signal set corresponding to the magnetic-field angle,
wherein the detection unit outputs a corrected angle signal of the rotatable body, and
wherein a difference ($\theta 2-\theta 1$) of the corrected angle signal $\theta 2$ and a simple angle signal $\theta 1$ calculated from the raw-angle signal set has a value dependent on a rotational velocity and independent of the simple angle signal $\theta 1$.

* * * * *